US008557686B1

(12) United States Patent
Zhu

(10) Patent No.: US 8,557,686 B1
(45) Date of Patent: Oct. 15, 2013

(54) GRAPHENE-BASED NON-VOLATILE MEMORY

(75) Inventor: Wenjuan Zhu, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/595,498

(22) Filed: Aug. 27, 2012

Related U.S. Application Data

(63) Continuation of application No. 13/588,906, filed on Aug. 17, 2012.

(51) Int. Cl.
*H01L 21/20* (2006.01)
(52) U.S. Cl.
USPC ............... 438/479; 257/254; 257/E27.085; 977/734
(58) Field of Classification Search
USPC ............... 257/E27.084, E27.098, E27.102; 438/269, 52, 53, 479; 365/129–188
See application file for complete search history.

(56) References Cited

U.S. PATENT DOCUMENTS

| 6,255,204 B1* | 7/2001 | Tobin et al. ............... 438/592 |
| 2004/0190189 A1* | 9/2004 | Lee ............... 360/78.04 |
| 2011/0101365 A1 | 5/2011 | Kim et al. |
| 2011/0215300 A1* | 9/2011 | Guo et al. ............... 257/29 |
| 2011/0260136 A1* | 10/2011 | Lee et al. ............... 257/9 |
| 2012/0051119 A1* | 3/2012 | Yamazaki et al. ............... 365/149 |
| 2012/0080656 A1 | 4/2012 | Choi et al. |
| 2012/0181510 A1* | 7/2012 | Avouris et al. ............... 257/29 |
| 2012/0199815 A1* | 8/2012 | Kondo et al. ............... 257/29 |

\* cited by examiner

*Primary Examiner* — Jarrett Stark
*Assistant Examiner* — Shahed Ahmed
(74) *Attorney, Agent, or Firm* — Cantor Colburn LLP; Vazken Alexanian

(57) ABSTRACT

Embodiments relate to a method of forming a graphene-based memory device. The method includes forming a forming a first graphene layer on an first insulator layer, and forming a second insulation layer on the first graphene layer. The method further includes forming a second graphene layer on the second insulation layer and forming an opening in the second insulation layer to expose a portion of the first graphene layer and a portion of the second graphene layer and to suspend the exposed portion of the second graphene layer in the opening.

21 Claims, 24 Drawing Sheets

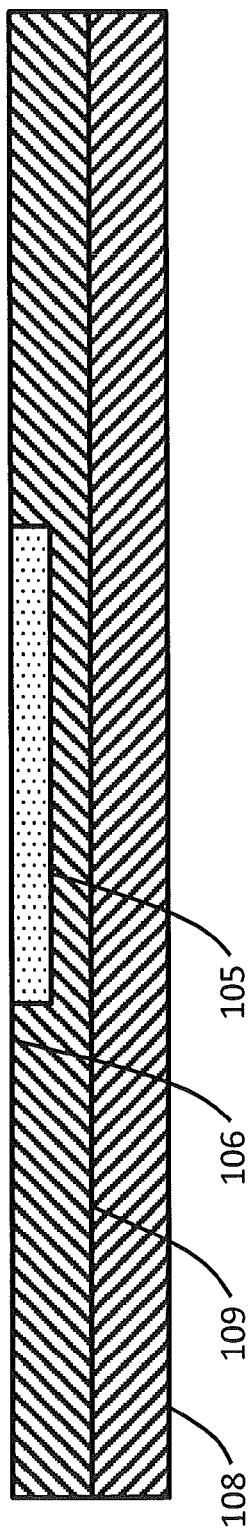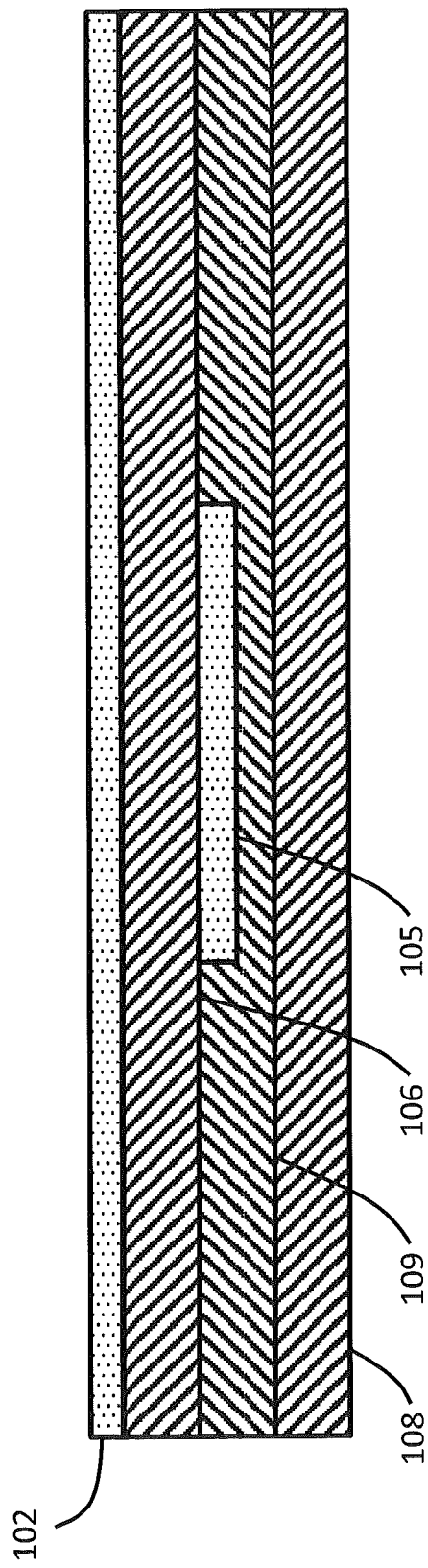

GRAPHENE-BASED NON-VOLATILE MEMORY

CROSS-REFERENCE TO RELATED APPLICATIONS

This application is a continuation of U.S. Non-Provisional application Ser. No. 13/588,906, entitled "GRAPHENE-BASED NON-VOLATILE MEMORY", filed Aug. 17, 2012, which is incorporated herein by reference in its entirety.

BACKGROUND

The present disclosure relates to graphene-based non-volatile memory.

Non-volatile memory can retain stored information even when not powered. Examples of non-volatile memory include flash memory, optical disks, such as compact disks (CDs) and digital versatile disks (DVDs), and magnetic computer storage devices such as hard disks, floppy disks, and magnetic tape. Generally, non-volatile memory either costs more or has poorer performance, such as a slower data access time, than volatile memory, such as random access memory (RAM).

SUMMARY

Exemplary embodiments include a method of forming a graphene-based memory device. The method includes forming a first graphene layer on a first insulator layer and forming a second insulation layer on the first graphene layer. The method further includes forming a second graphene layer on the second insulation layer and forming an opening in the second insulation layer to expose a portion of the first graphene layer and a portion of the second graphene layer and to suspend the exposed portion of the second graphene layer in the opening.

Additional exemplary embodiments include a method of forming a graphene-based memory device. The method includes providing a substrate, forming a first insulator on the substrate, and forming a back gate in the first insulation layer. The method further includes forming a second insulation layer on the back gate and the first insulation layer, transferring a lower graphene layer onto the second insulation layer, and forming a third insulation layer on the lower graphene layer. The method further includes forming an upper graphene layer on the third insulation layer and forming an opening in the third insulation layer between the lower graphene layer and the upper graphene layer to form a suspended portion of the upper graphene layer and an exposed portion of the lower graphene layer.

Further exemplary embodiments include a method of forming a graphene-based memory circuit. The method includes forming a graphene-based memory device including first and second graphene layers and a back gate. The first graphene layer is bendable with respect to the second graphene layer based on a voltage level of the backgate. The method further includes forming a world line connected to the back-gate, forming a bit line connected to the first graphene layer, and forming a read line connected to the second graphene layer.

Additional features and advantages are realized through the techniques of the present disclosure. Other embodiments and aspects of the present disclosure are described in detail herein and are considered a part of the claimed disclosure. For a better understanding of the disclosure with the advantages and the features, refer to the description and to the drawings.

BRIEF DESCRIPTION OF THE SEVERAL VIEWS OF THE DRAWINGS

The subject matter of the disclosure is particularly pointed out and distinctly claimed in the claims at the conclusion of the specification. The forgoing and other features, and advantages of the disclosure are apparent from the following detailed description taken in conjunction with the accompanying drawings in which:

FIG. 7A illustrates a memory circuit in a first data state, and FIG. 7B illustrates the memory circuit in a second data state;

FIG. 12A illustrates a method of performing a write operation according to one embodiment;

FIG. 12B illustrates a method of performing a read operation according to one embodiment;

FIG. 12C illustrates a method of performing an erase operation according to one embodiment;

FIGS. 14-19 illustrate a method of fabricating a memory device according to one embodiment;

FIG. 14 illustrates the an insulation layer on a substrate and forming a back gate in the insulation layer;

FIG. 15 illustrates forming an insulation layer on the back gate and forming a lower graphene layer on the insulation layer;

FIG. 16 illustrates forming an insulating layer on the lower graphene layer and forming an upper graphene layer;

FIG. 17 illustrates forming an insulation layer on the upper graphene layer;

FIG. 18 illustrates forming electrodes in the insulation layers to contact the graphene layers;

FIG. 19 illustrates forming an opening to expose portions of the graphene layers;

FIG. 21 illustrates forming a top gate;

FIG. 22 illustrates forming electrodes in the insulation layers;

FIG. 23 illustrates forming an opening to expose portions of the graphene layers.

DETAILED DESCRIPTION

Conventional non-volatile memory, including magnetic and optical disks, may be slow, expensive, and may be limited in the materials that may be used to manufacture the devices. In exemplary embodiments of the present disclosure, non-volatile memory may be formed of two graphene layers programmable by an electrostatic charge to hold program information even when no power is supplied to the memory.

Figure 1:
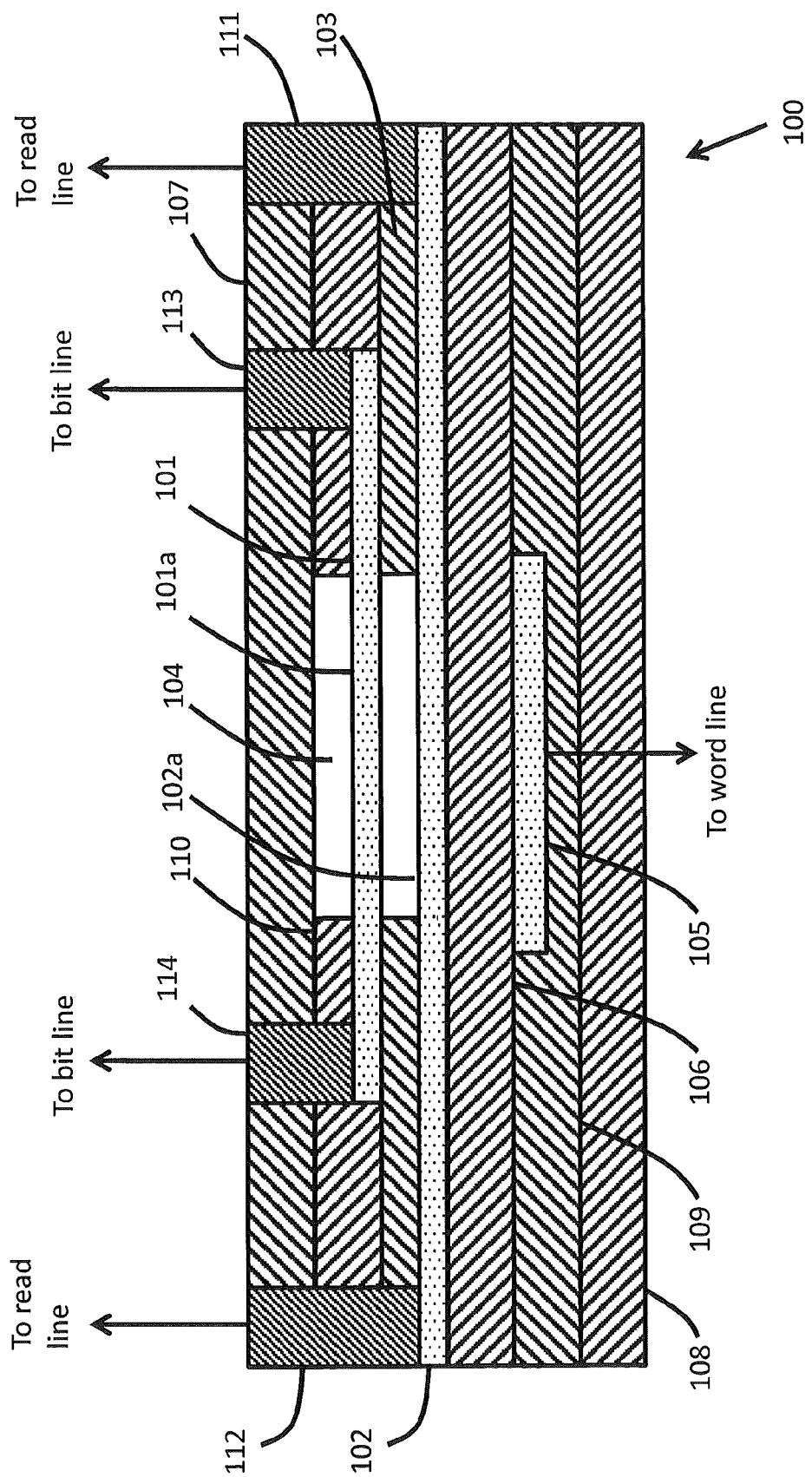
FIG. 1 illustrates a memory device according to one embodiment of the present disclosure.

FIG. 1 illustrates a memory device 100 according to an embodiment of the disclosure. The memory device 100 includes a first graphene layer 101 and a second graphene layer 102 separated by an insulation layer 103. The insulation layer 103 includes an opening 104. A suspended portion 101a of the first graphene layer 101 is suspended in the opening 104, and an exposed portion 102a of the second graphene layer 102 is exposed to the opening 104. In embodiments of the present disclosure, it is understood that the term "graphene" is provided with its ordinary meaning of an atom-thick lattice structure of carbon atoms. However, it is understood that each of the first and second graphene layers 101 and 102 may include multiple stacked graphene layers according to some embodiments. For example, the first graphene layer 101 may comprise a plurality of stacked single-atom-thick graphene layers so that the first graphene layer 101 may actually be multiple atom-layers thick.

The memory device 100 includes a back gate 105 located on an opposite side of the second graphene layer 102 from the first graphene layer 101. In particular, the back gate 105 may be located in-line with the opening 104, the suspended portion 101a of the first graphene layer 101 and the exposed portion 102a of the second graphene layer 102. The memory device 100 may include various insulation layers including an insulation layer 106 between the back gate 105 and the second graphene layer 102, an insulation layer 107 defining an upper end of the memory device 100, a substrate 108, an insulation layer 109 that is formed on the substrate 108 and in which the back gate 105 is formed, and an insulation layer 110 located between the insulation layers 103 and 107 in which the first graphene layer 101 is formed. Although various insulation layers are illustrated for purposes of description, it is understood that one or more of the insulation layers may be combined or additional insulation layers may be provided.

The memory device 100 further includes one or more drains 111 and 112 electrically connected to the second graphene layer 102. The memory device 105 further includes one or more floating channel electrodes 113 and 114 electrically connected to the first graphene layer 101. In a circuit including the memory device 100, the drains 111 and 112 may be connected to a read line, the floating channel electrodes 113 and 114 may be connected to a bit line and the back gate 105 may be connected to a word line.

In embodiments of the present disclosure, the substrate 108 and insulation layers 103, 106, 107, 109 and 110 may be formed of a same material or different materials. For example, the substrate 108 may be selected from the following substrates: semiconductor substrates such as bulk silicon, silicon-on-insulator (SOI), silicon carbide, silicon germanium, germanium, III-V compound, or a II-VI compound, insulator substrates such as quartz and sapphire, and polymer substrates such as polyethylene terephthalate (PET) film. The insulation layers may also include silicon oxide, silicon nitride, aluminum oxide, hafnium oxide, titanium oxide, tantalum oxide, lanthanum oxide etc. The back gate 105 may be formed of highly doped poly-silicon or embedded metals. Similarly, the drains 111 and 112 and the floating channel electrodes 113 and 114 may be formed of any desired conductive material capable of conducting a voltage to the first and second graphene layers 101 and 102.

The opening 104 in the insulating layer 103 is configured to be sufficiently long to allow the first graphene layer 101 to bend into the opening 103 to contact the second graphene layer 102. Accordingly, the width of the opening 103 may depend upon the thickness of the first graphene layer 101 or the number of stacked single-atom graphene layers that comprise the first graphene layer 101. In one embodiment, the opening 104 is between about 1 μm (micron, or micrometer) to about 15 μm in length. In one embodiment, the insulation layer 103 has a thickness of between about 3 nm and about 15 nm. In one embodiment, the first graphene layer 101 is between one atom-layer and twenty atom-layers thick. In other words, in this embodiment, the first graphene 101 layer comprises between one and twenty stacked single-atom-thick graphene layers. Similarly, in one embodiment, the second graphene layer 102 is between one atom-layer and twenty atom-layers thick.

Figure 2:
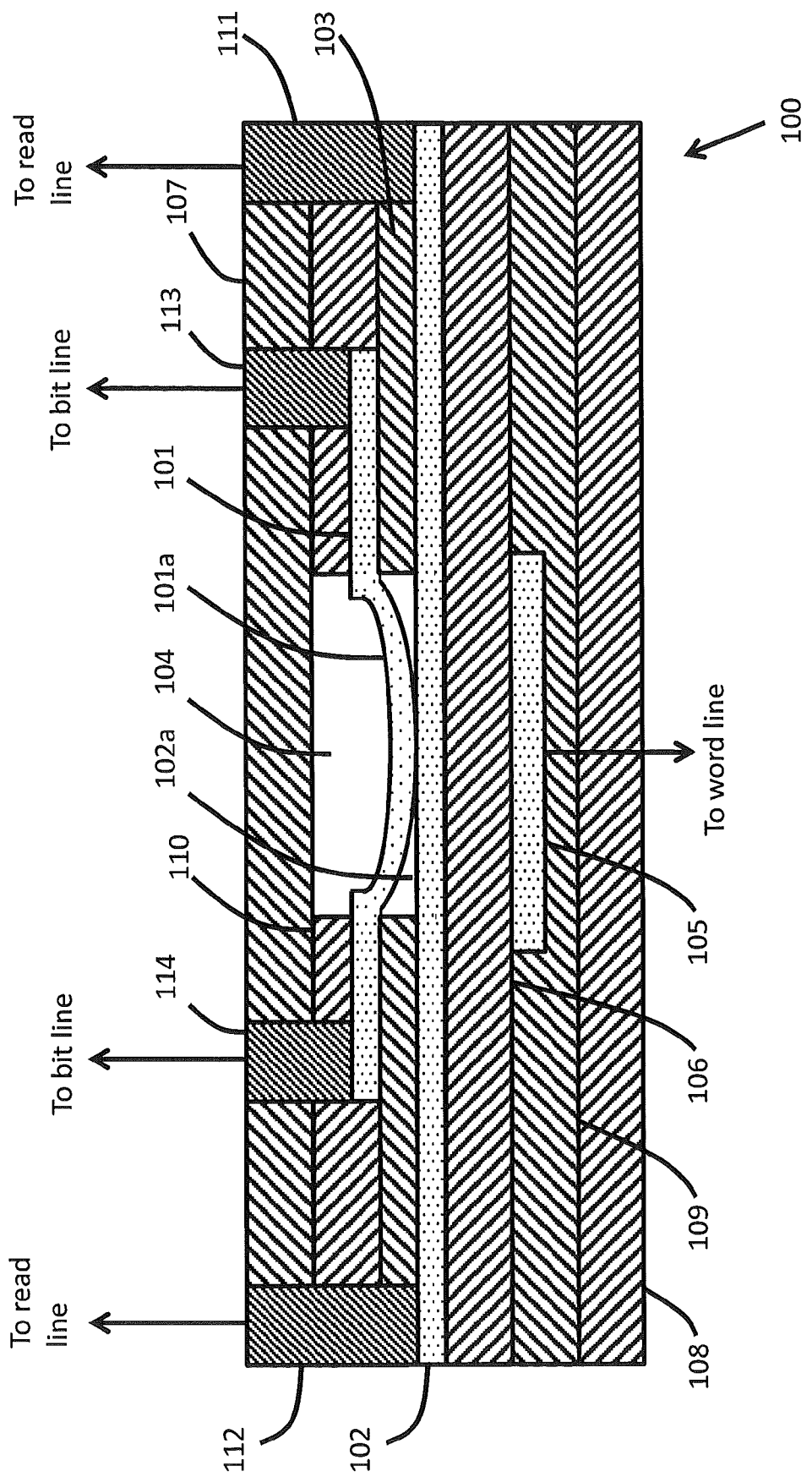
FIG. 2 illustrates a memory device according to an embodiment.

In operation, the memory device 100 may be programmed by applying an electrostatic force to the suspended portion 101a of the first graphene layer 101. FIG. 2 illustrates an example of a programmed memory device 100. In particular, a low voltage level may be applied to the floating channel electrodes 113 and 114 and a high voltage level may be applied to the back gate 105. The voltage difference between the back gate 105 and the suspended portion 101a of the first graphene layer 101 results in an electrostatic charge that bends the suspended portion 101a into the opening 104 and into contact with the exposed portion 102a of the second graphene layer 102. The first graphene layer 101 maintains the bent shape even when power is not applied to the memory device 100, providing non-volatile memory.

In a read operation, a low voltage may be applied to the floating channel electrodes 113 and 114 and a high voltage may be applied to the drains 111 and 112. If a high current is detected at the drains 111 or 112 or the floating channel electrodes 113 or 114, then the memory device 100 is in a programmed state, since the contact between the suspended portion 101a and the exposed portion 102a will allow current to flow. On the other hand, if low current is detected at the drains 111 or 112 or the floating channel electrodes 113 or 114, then there is no contact between the suspended portion 101a of the first graphene layer 101 and the exposed portion 102a of the second graphene layer 102, indicating that the memory device 100 has not been programmed. In embodiments of the present disclosure, the term "programmed" refers to a state in which the first graphene layer 101 is bent to contact the second graphene layer 102. In addition, the term "program state" refers to either the "programmed" state in which the first graphene layer 101 is bent to contact the second graphene layer 102, or the "un-programmed" state, or in some embodiments the "erased" state, in which the first graphene layer 101 is not bent to contact the second graphene layer 102.

Figure 3:
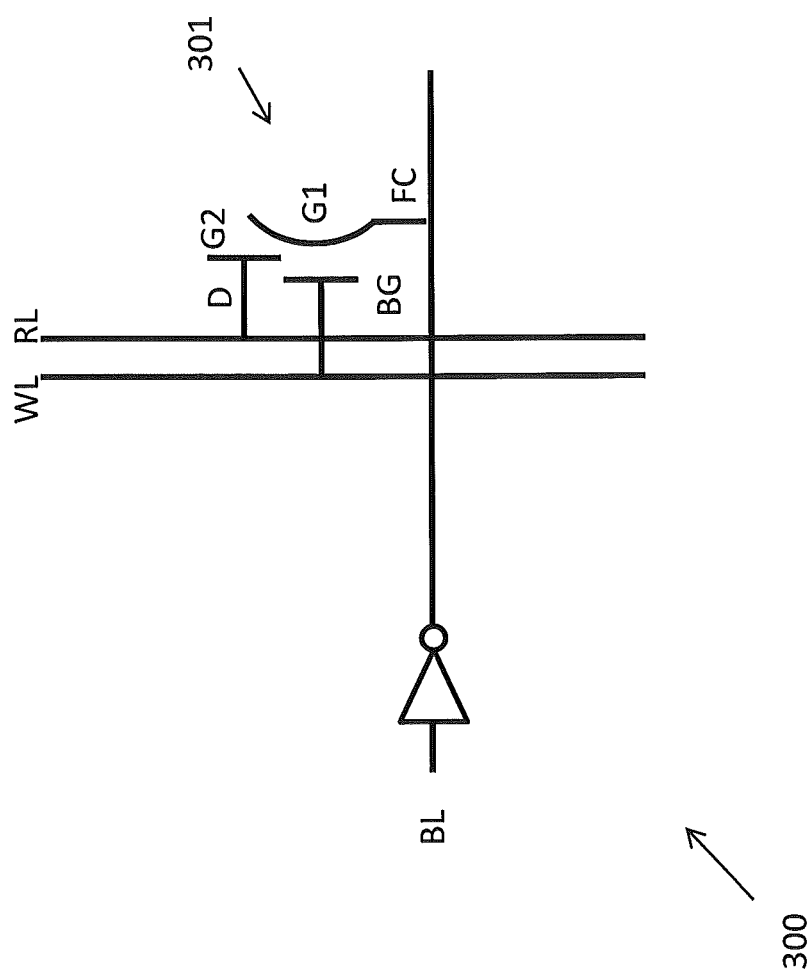
FIG. 3 illustrates a memory circuit according to one embodiment.

FIG. 3 illustrates a circuit 300 including a memory device 301 according to one embodiment. The memory device 301 may correspond to the memory device 100 of FIG. 1. As illustrated in FIG. 3, the back gate (BG) may be connected to a word line (WL), the drain (D) and second graphene layer (G2) may be connected to a read line (RL) and the floating channel electrodes (FC) and first graphene layer (G1) may be connected to a bit line (BL). The bit line BL may include an inverter.

Voltages may be applied to the back gate BG, drain D and floating channel electrode FC, respectively, by applying voltages to the word line WL, read line RL, and bit line BL, respectively. For example, to program the memory device 301, a high voltage may be applied to the word line WL and the bit line BL, resulting in a high voltage at the back gate BG and a low voltage at the floating channel electrode FC due to the inverter located along the bit line BL. Conversely, a program state of the memory device 301 may be read by applying a high voltage at the bit line BL and a high voltage at the read line RL, and measuring a current through the read line RL or the bit line BL. If the memory device 301 is programmed and the first graphene layer G1 is in contact with the second graphene layer G2, a current will flow between the high voltage bias of the read line RL and the low voltage bias (due to the inverter) of the bit line BL.

According to the above embodiments, a write-once and read-only non-volatile memory may be formed of two graphene layers separated by an insulation layer including an opening through which the graphene layers may contact each other.

Figure 4:
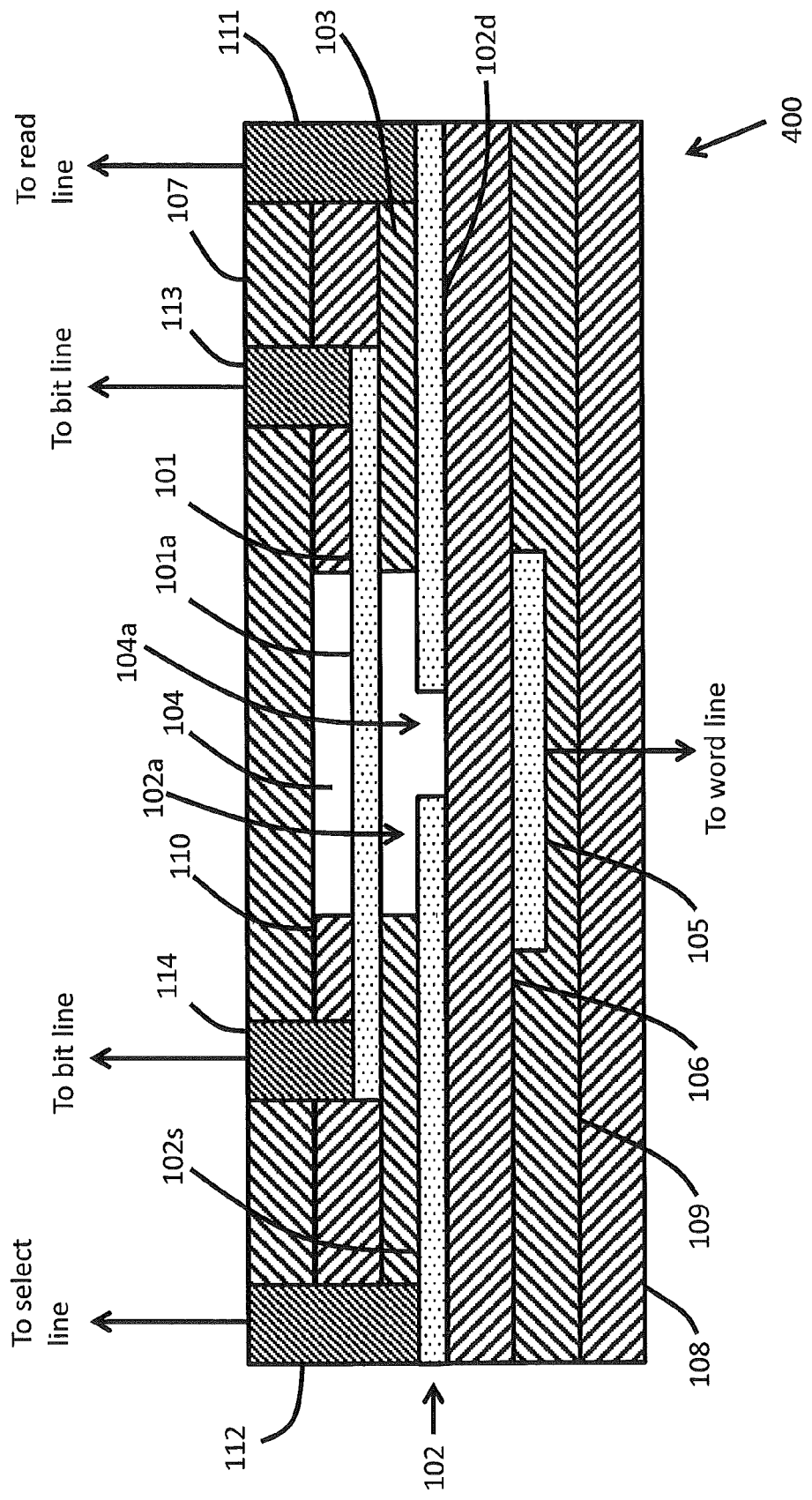
FIG. 4 illustrates a memory device according to another embodiment.
Figure 5:
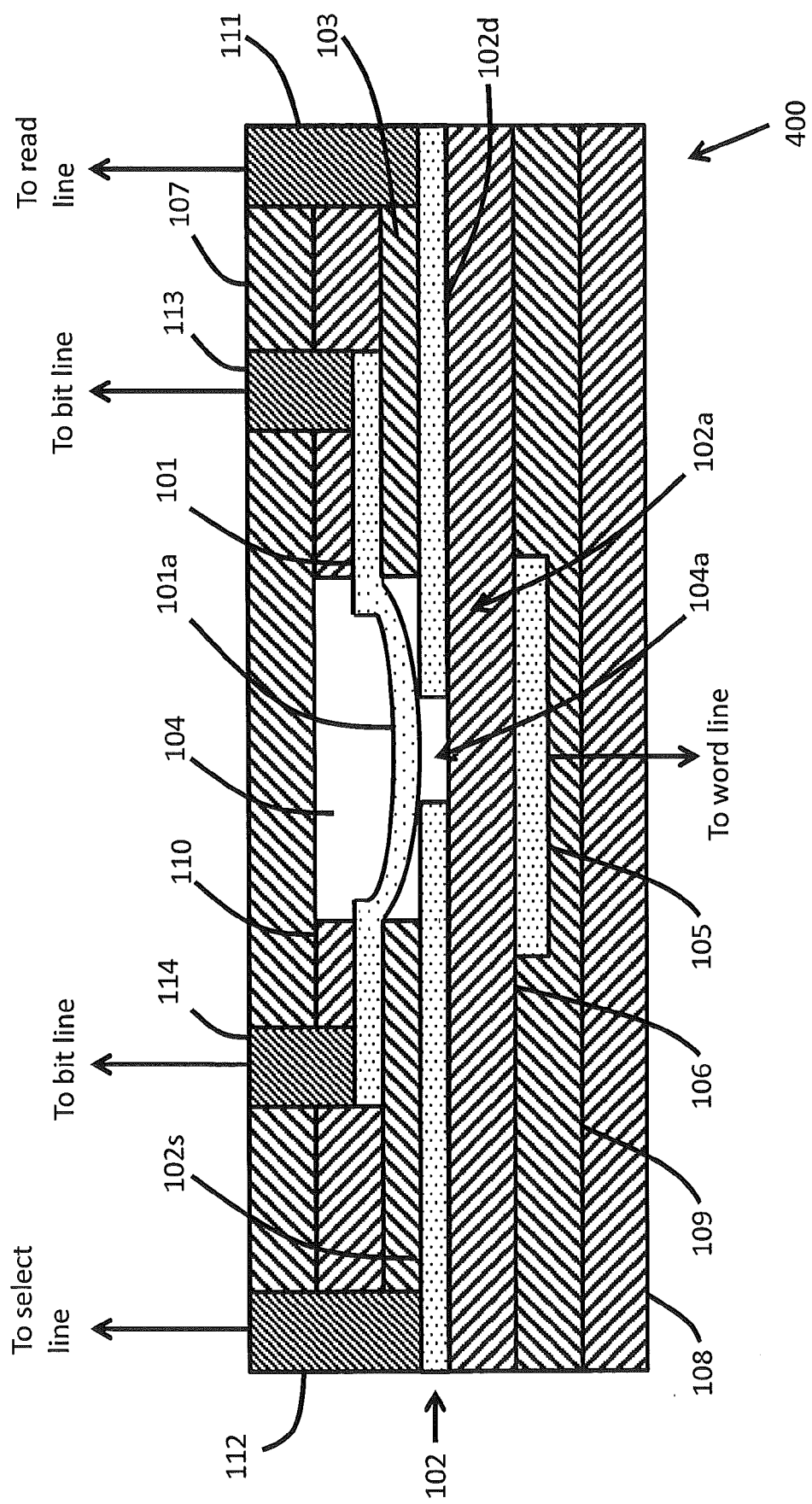
FIG. 5 illustrates a memory device according to an embodiment.

FIG. 4 illustrates a memory device 400 according to another embodiment of the present disclosure. The memory device 400 is similar to the memory device 100 of FIG. 1, except the second graphene layer 102 includes a source portion 102s and a drain portion 102d separated by a slit 104a. The length of the slit 104a may be in the range of 5 nm to 200 nm. As illustrated in FIG. 5, when an electrostatic force is generated by the back gate 105, the suspended portion 101a of the first graphene layer 101 is bent towards the exposed portion 102a of the second graphene layer 102. In particular, the suspended portion 101a of the first graphene layer 101 contacts an edge or ends of the source portion 102s and the drain portion 102d of the second graphene layer 102, bridging the slit 104a.

Figure 6:
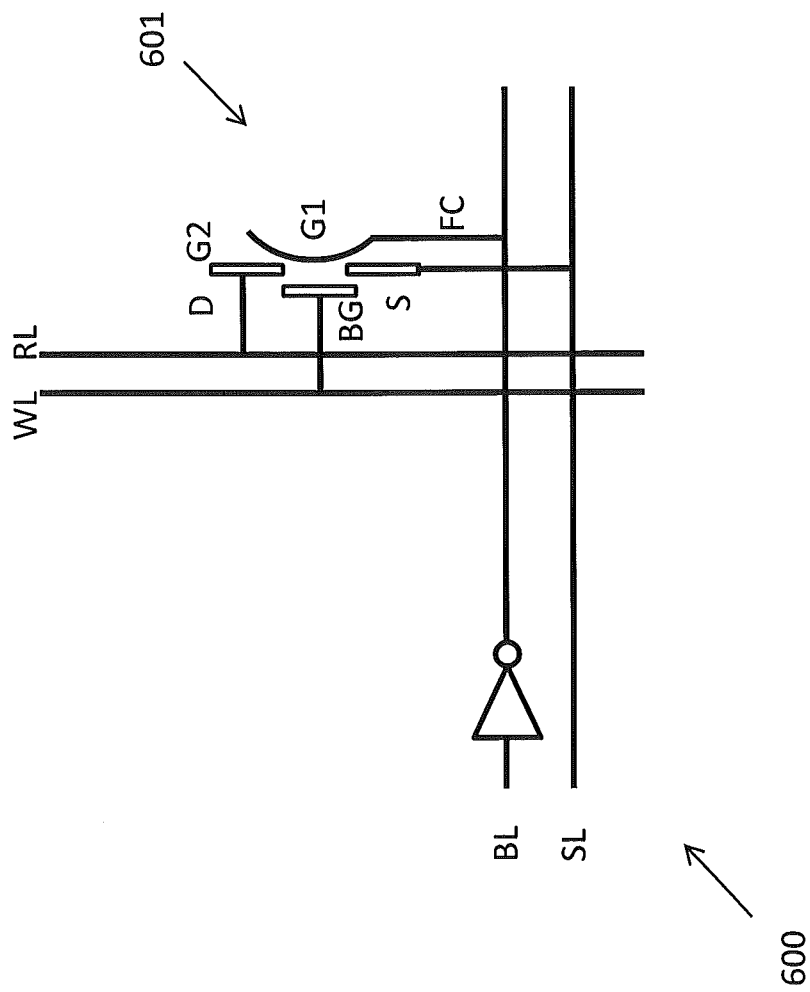
FIG. 6 illustrates a memory circuit according to another embodiment.

As illustrated in FIG. 6, a memory circuit 600 includes the memory device 601, which may correspond to the memory device 400 of FIGS. 4 and 5. The source portion S is connected to a select line (SL) and the drain portion D is connected to the read line RL. Voltages may be applied to the back gate BG, source (S) and floating channel electrode FC, respectively, by applying voltages to the word line WL, select line SL, and bit line BL, respectively. For example, to program the memory device 601, a high voltage may be applied to the word line WL and the bit line BL, resulting in a high voltage at the back gate BG and a low voltage at the floating channel electrode FC due to the inverter located along the bit line BL.

Conversely, a program state of the memory device 601 may be read by applying a high voltage at the read line RL and applying a low voltage the select line SL. A current through the read line RL may be measured. If the memory device 601 is programmed and the first graphene layer G1 is in contact with second graphene layer G2 including the source S and the drain D portions, a high current will flow between the high voltage bias of the read line RL and the low voltage bias of the select line S. If the memory device 601 is not programmed, low current will flow between the high voltage bias of the read line RL and the low voltage bias of the select line SL. Alternatively, the memory device 601 may be read by applying a high voltage at the read line RL and the bit line BL. Due to the inverter between the bit line BL and the floating channel electrode FC, a low voltage will be applied to the floating channel electrode FC. If the memory device 601 is programmed and the first graphene layer G1 is in contact with the source S and the drain D of the second graphene layer G2, a high current will flow between the read line RL and the bit line BL. If the memory device 601 is not programmed, a low current will flow between the read line SL and the bit line BL.

Figures 7A, 7B:
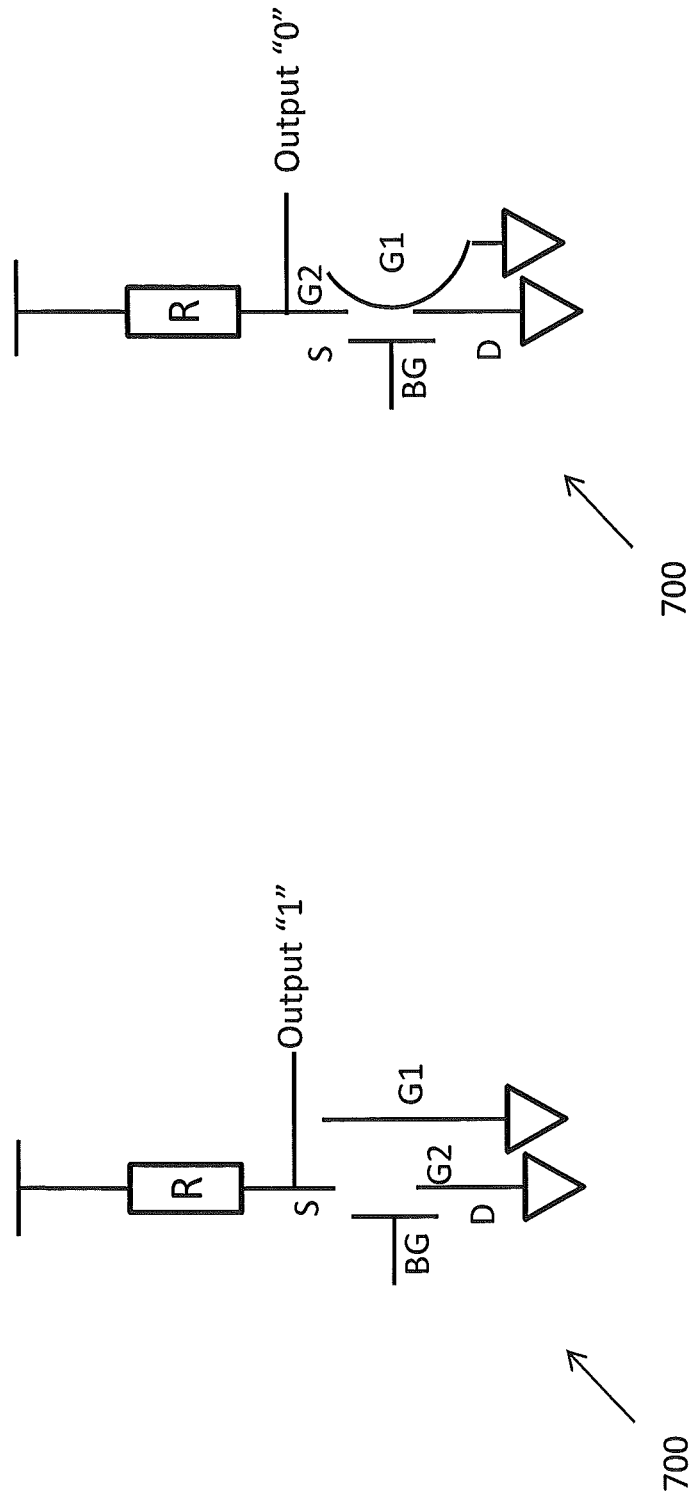
FIGS. 7A and 7B illustrate a memory circuit according to one embodiment.

FIGS. 7A and 7B illustrate an electrical diagram of the memory circuit 700 according to another embodiment. The memory circuit 700 may correspond to the memory circuit 400 of FIG. 4 and the memory circuit 600 of FIG. 6, for example. As illustrated in FIG. 7A, the drain D and first graphene layer G1 may both be connected to a ground source, or a low voltage source, and the source S of the second graphene layer G2 may be connected to a high voltage source via a resistor R. In an unprogrammed state, illustrated in FIG. 7A, an output at the source S is high, or "1", corresponding to the voltage level of the voltage source. However, when the memory circuit 700 is in a programmed state, as illustrated in FIG. 7B, the source S is connected to ground, or the low voltage source, via the drain D of the second graphene layer G2 and the first graphene layer G1, driving the output low, or to "0." Accordingly, the program state of the memory circuit 700 may be detected by detecting a voltage level of the source S of the memory circuit 700.

Figure 8:
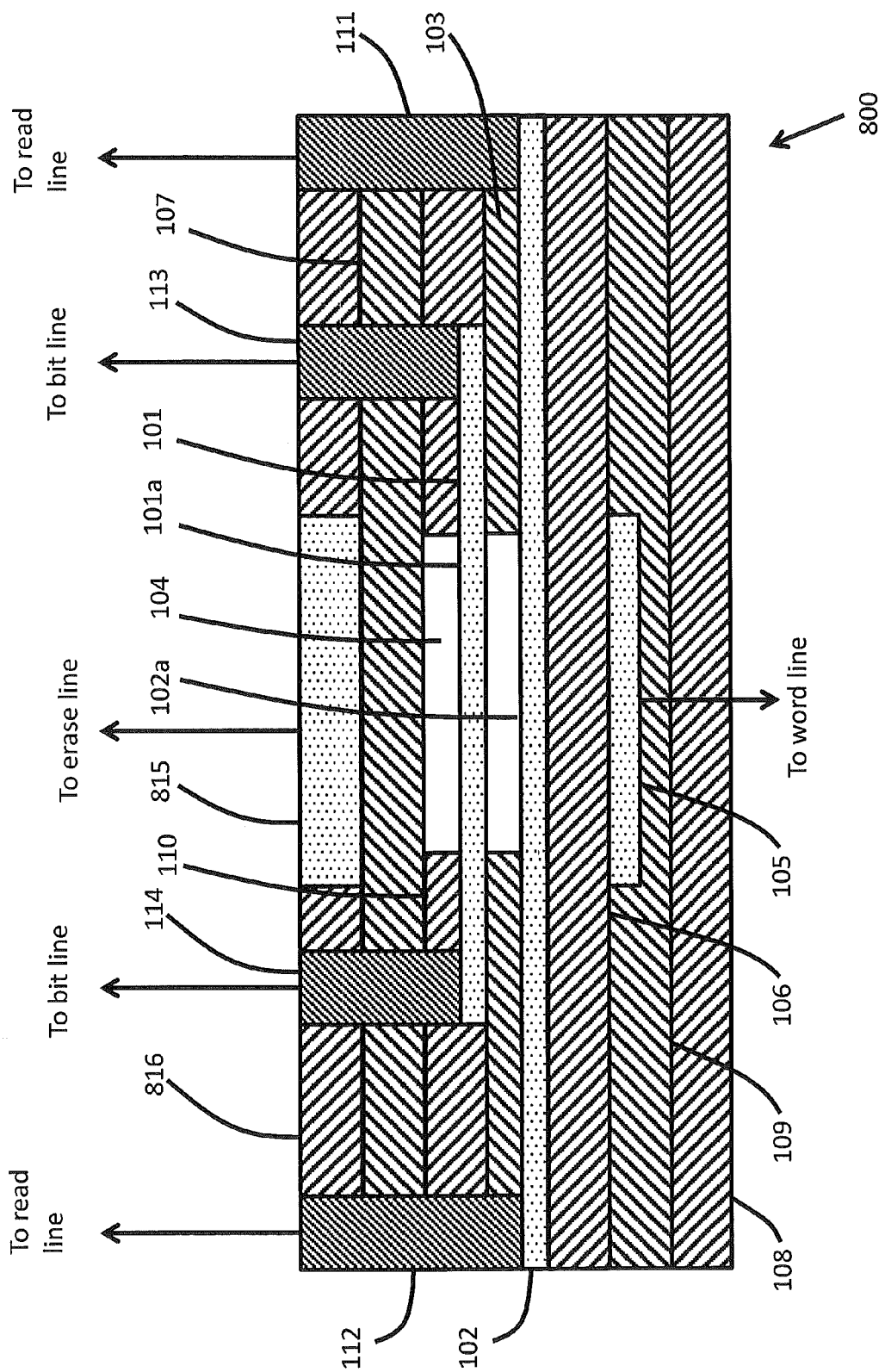
FIG. 8 illustrates a memory device according to another embodiment.

FIG. 8 illustrates a memory device 800 according to another embodiment of the present disclosure. The memory device 800 of FIG. 8 is similar to the memory device 100 of FIG. 1, except that the memory device 800 is capable of being erased and re-programmed by way of a top gate 815. In particular, the top gate 815 is formed on a side of the first graphene layer 101 opposite the second graphene layer 102. The top gate 815 may be formed in an insulation layer 816 formed on the insulation layer 107 described in FIG. 1. The drains 111 and 112 and the floating channels 113 and 114 may extend through the insulation layer 816. The top gate 715 may be formed of highly-doped poly-silicon or metals.

Figure 9:
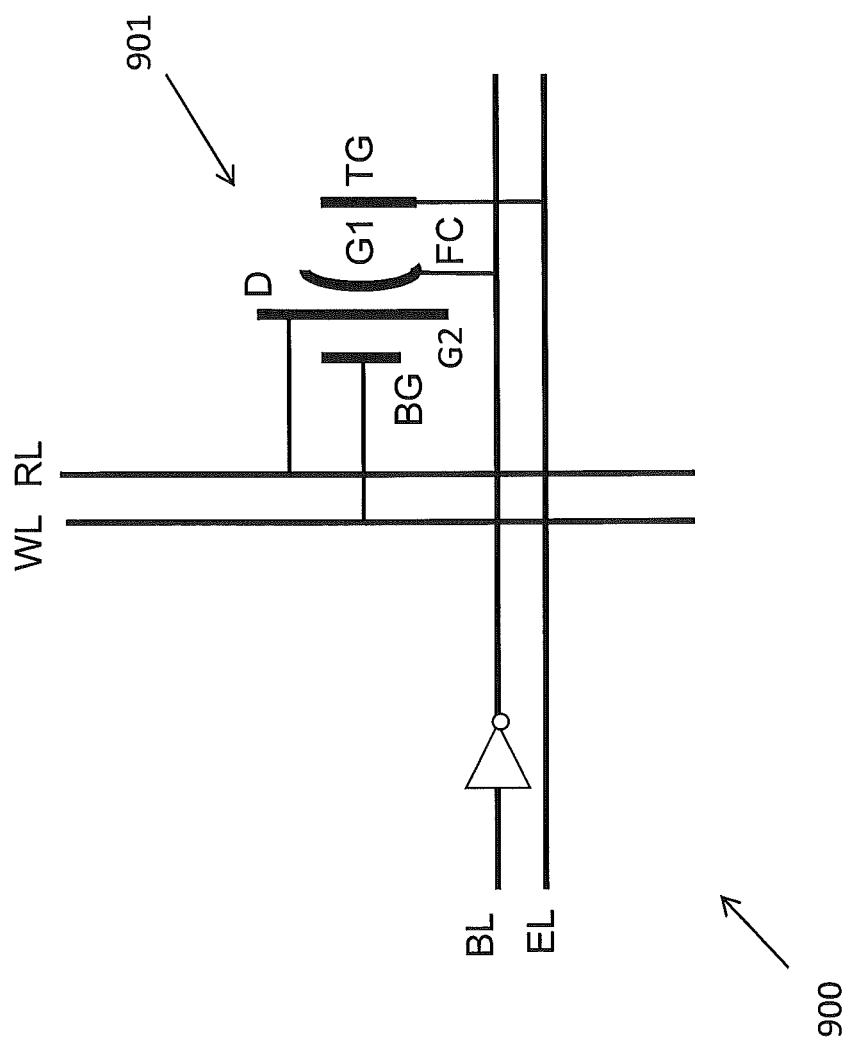
FIG. 9 illustrates a memory circuit according to another embodiment.

FIG. 9 illustrates a memory circuit 900 according to an embodiment of the present disclosure. The memory circuit 900 includes a memory device 901, which may correspond to the memory device 800 of FIG. 8. The back gate BG may be connected to a word line WL, the drain D and the second graphene layer G2 may be connected to a read line RL and the floating channel electrode FC and the first graphene layer G1 may be connected to a bit line BL, the top gate TG may be connected to an erase line (EL).

In operation, the memory device 901 may be programmed in the same manner as described above with respect to FIG. 1. In particular, the memory device 901 may be programmed by applying a high voltage level to the word line WL and bit line BL. Due to the inverter, a low voltage will be applied to the floating channel electrode FC and the first graphene layer G1. The voltage difference between the back gate 105 and the suspended portion 101a of the first graphene layer G1 results in an electrostatic charge that bends the suspended portion 101a into the opening 104 and into contact with the exposed portion 102a of the second graphene layer 102. The first graphene layer G1 maintains the bent shape even when power is not applied to the memory device 901, providing non-volatile memory.

The program state of the memory device 901 may be erased by applying a high voltage on the erase line EL and bit line BL. Due to the inverter, a low voltage will be applied to the floating channel electrode FC and the first graphene layer G1. The voltage difference between the top gate TG and the suspended portion of the first graphene layer G1 results in an electrostatic charge that bends the suspended portion away from the exposed portion of the second graphene layer G2 to return the memory device 901 to an un-programmed state.

Conversely, a program state of the memory device 901 may be read by applying a high voltage at the bit line BL and a high voltage at the read line RL, and measuring a current through the read line RL or the bit line BL. If the memory device 901 is programmed and the first graphene layer G1 is in contact with the second graphene layer G2, a current will flow between the high voltage bias of the read line RL and the low voltage bias (due to the inverter) of the bit line BL.

Figure 10:
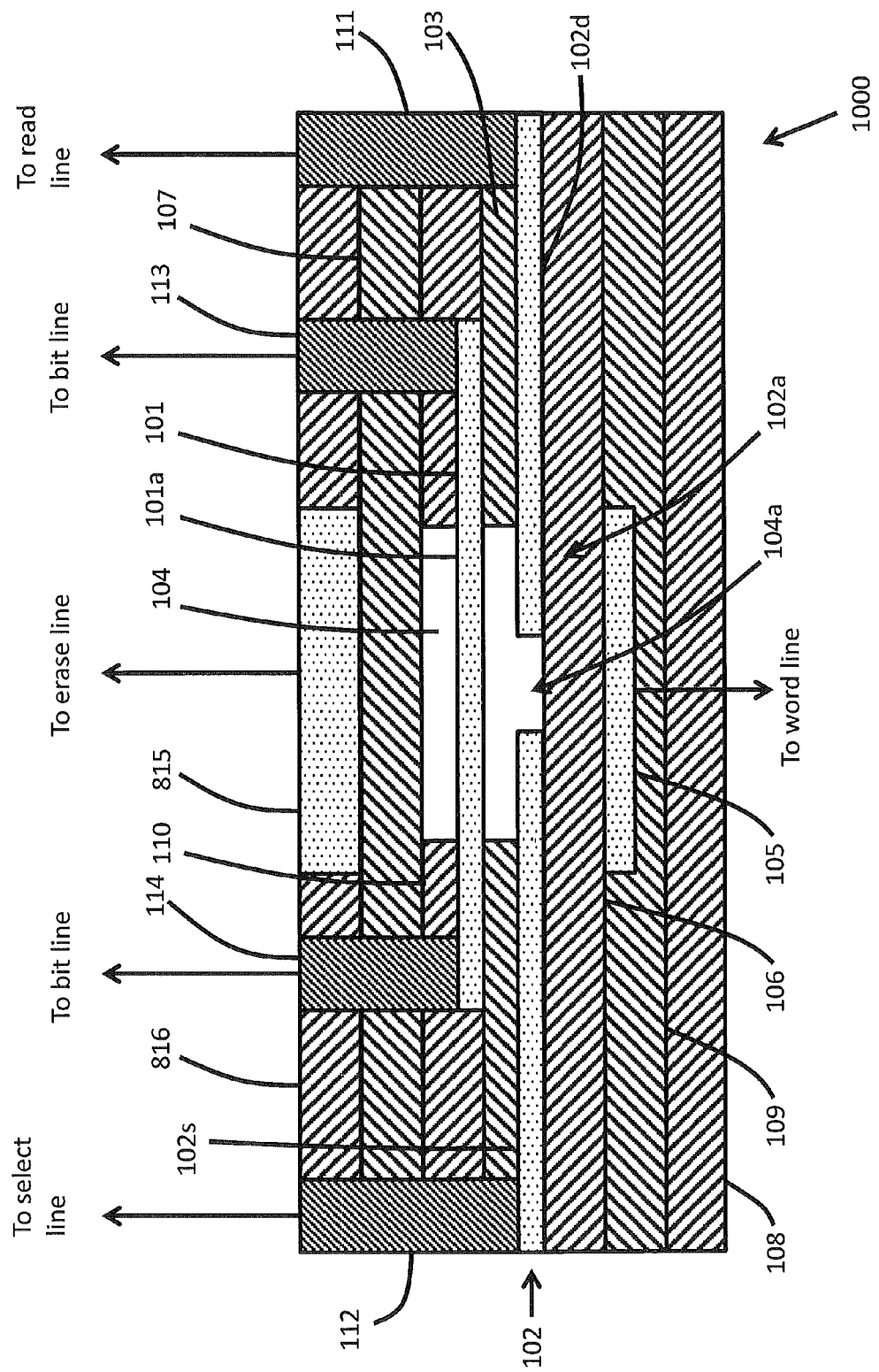
FIG. 10 illustrates a memory device according to another embodiment.

FIG. 10 illustrates a memory device 1000 according to another embodiment of the present disclosure. The memory device 1000 of FIG. 10 is similar to the memory device 400 of FIG. 4, except that the memory device 1000 is capable of being erased and re-programmed by way of a top gate 815. In particular, the top gate 815 is formed on a side of the first graphene layer 101 opposite the second graphene layer 102. The top gate 815 may be formed in an insulation layer 816 formed on the insulation layer 107 described in FIG. 4. The drains 111 and 112 and the floating channel electrodes 113 and 114 may extend through the insulation layer 816.

The memory device 1000 may be programmed in a manner similar to the memory device 400 described above with respect to FIG. 4. However, the memory device 1000 may also be erased and re-programmed. The program state of the memory device 1000 may be erased by applying a low voltage level to the floating channel electrodes 113 and 114 and a high voltage level to the top gate 815. The voltage difference between the top gate 815 and the suspended portion 101a of the first graphene layer 101 results in an electrostatic charge that bends the suspended portion 101a away from the exposed portion 102a of the second graphene layer 102 to return the memory device 1000 to an un-programmed state.

Figure 11:
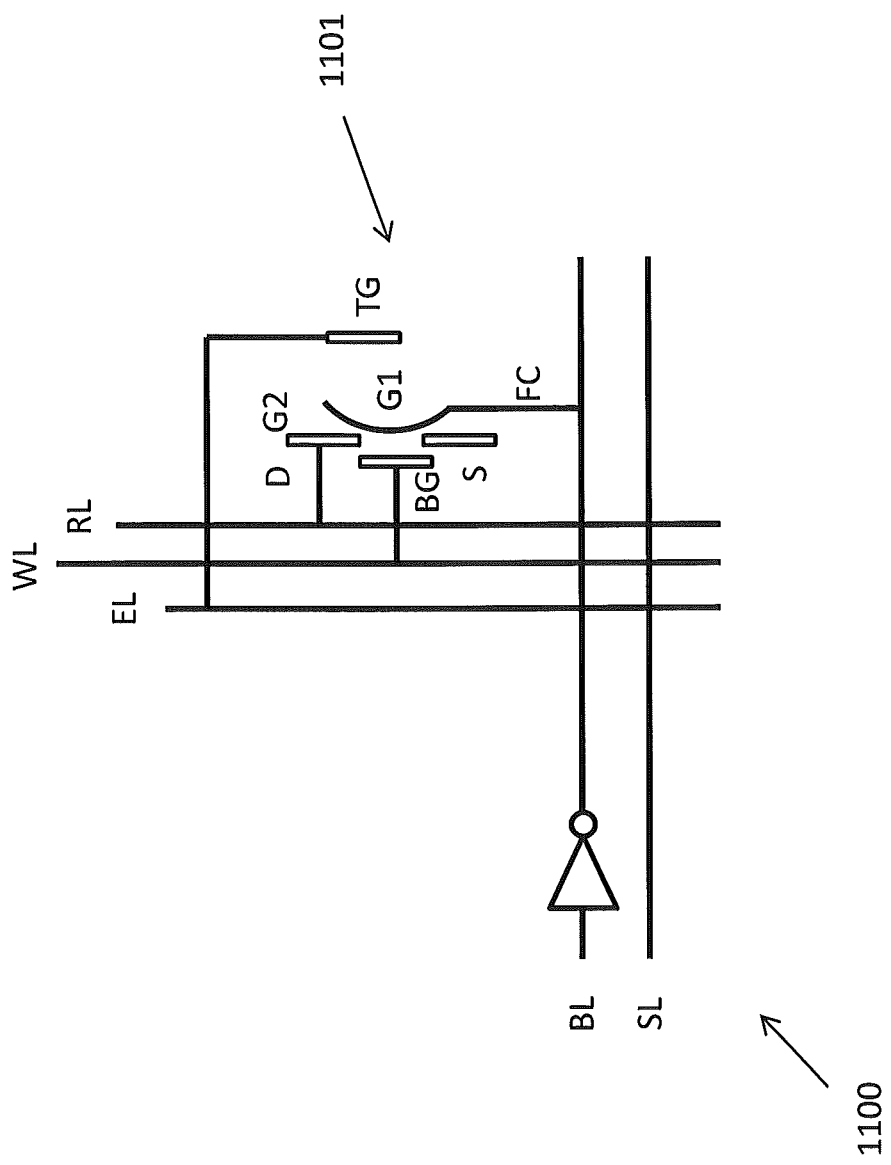
FIG. 11 illustrates a memory circuit according to another embodiment.

FIG. 11 illustrates a memory circuit 1100 according to an embodiment of the present disclosure. The memory circuit 1100 includes a memory device 1101, which may correspond to the memory device 1000 of FIG. 10. The source portion S is connected to a select line SL and the drain portion D of the second graphene layer G2 is connected to the read line RL. Voltages may be applied to the back gate BG, source S, drain D and floating channel electrode FC, respectively, by applying voltages to the word line WL, select line SL, read line RL and bit line BL, respectively. For example, to program the memory device 1101, a high voltage may be applied to the word line WL and the bit line BL, resulting in a high voltage at the back gate BG and a low voltage at the floating channel electrode FC due to the inverter located along the bit line BL.

Conversely, a program state of the memory device 1101 may be read by applying a high voltage at the select line SL and applying a low voltage at the bit line BL and the read line RL. In one embodiment, a current through the read line RL, the select line SL or the bit line BL may be measured. Alternatively, a voltage may be detected at the select line SL. If the memory device 1101 is programmed and the first graphene layer G1 is in contact with the source S and the drain D, a current will flow between the high voltage bias of the select line SL and the low voltage bias (due to the inverter) of the bit line BL and the read line RL. In addition, a low voltage will be output from the select line SL, as the select line SL is connected to the low voltage sources of the bit line BL and the read line RL. If the memory device 1101 is not programmed, low current will flow between the high voltage bias of the select line SL and the low voltage bias (due to the inverter) of the bit line BL and the read line RL. In addition, a high voltage will be output from the select line SL corresponding to a voltage level of a voltage source connected to the select line SL, since the select line SL is disconnected from the low voltage sources of the bit line BL and the read line RL.

The memory circuit 1100 may be erased to an unprogrammed state by applying a high voltage level to the bit line BL and the erase line (EL). The inverter drives the voltage at the floating channel electrode FC low, and the voltage difference between the top gate TG and the first graphene layer G1 results in an electrostatic charge that bends the first graphene layer G1 away from the source S and drain D of the second graphene layer G2 to return the memory device 1101 to an un-programmed state.

Figure 12B:
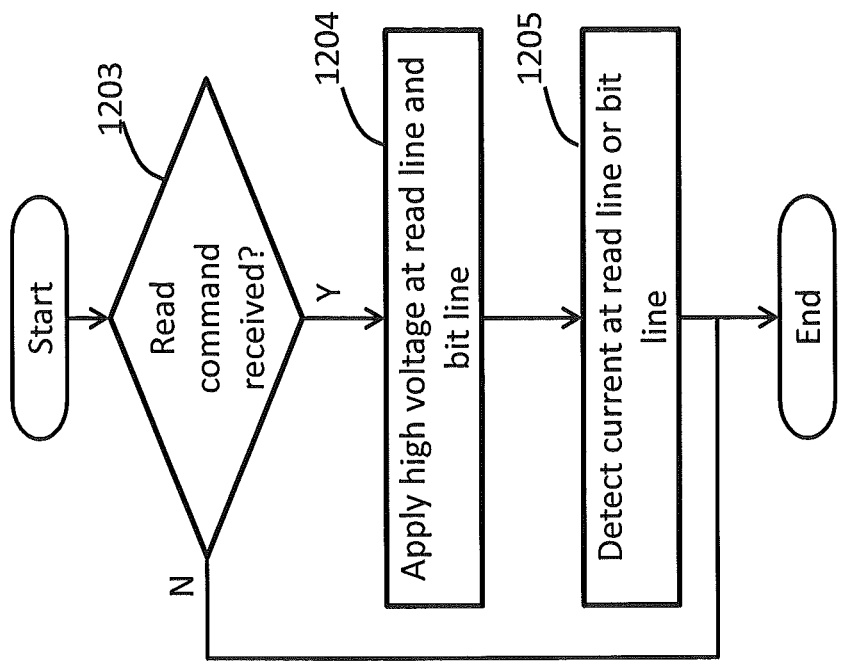
FIGS. 12A-12C are flowcharts illustrating methods of controlling graphene-based memory according to one embodiment.
Figure 12A:
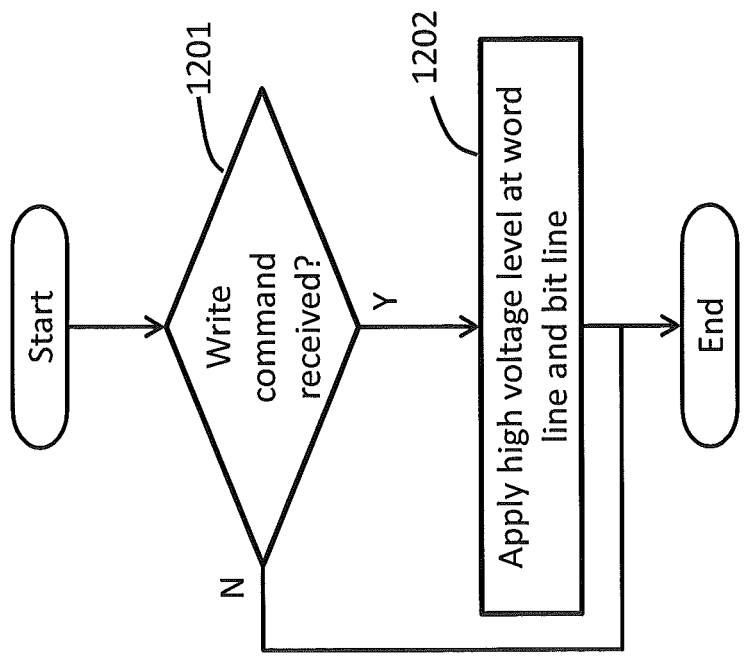

FIG. 12A is a flowchart illustrating a method of performing a write command with a graphene-based memory device according to an embodiment of the present disclosure. The graphene-based memory device may be a device having first and second graphene layers separated by an insulation layer. The insulation may have an opening such that an electrostatic force may cause the first graphene layer to bend into the opening to contact the second graphene layer, placing the graphene-based memory device in a programmed state. In block 1201, it is determined whether a write command is received. The write command may be received, for example, by a program or operating system operating on a processor. If the write command is received in block 1201, a high voltage level is applied to a word line and a bit line of a graphene-based memory device in block 1202, resulting in a low voltage applied at a floating channel electrode and a first graphene layer having a suspended portion and a high voltage applied at a back gate located on an opposite side of a second graphene layer from the suspended portion of the first graphene layer. The high voltage at the back gate generates an electrostatic force that bends the suspended portion of the first graphene layer to the second graphene layer to place the graphene-based memory device in a programmed state.

FIG. 12B illustrates a method of performing a read operation with the graphene-based memory device. In block 1203, it is determined whether a read command is received. The read command may be received, for example, by a program or operating system operating on a processor. If a read command is received, a high voltage may be applied to a read line and a bit line of a graphene-based memory device in block 1204, where the bit line is connected to the memory device via an inverter. A current may be detected in block 1205 at the read line or the bit line. If a current is detected, then it may be determined that the memory device is in a programmed state, and if low current is detected, it may be determined that the memory device is in an un-programmed state.

Figure 12C:
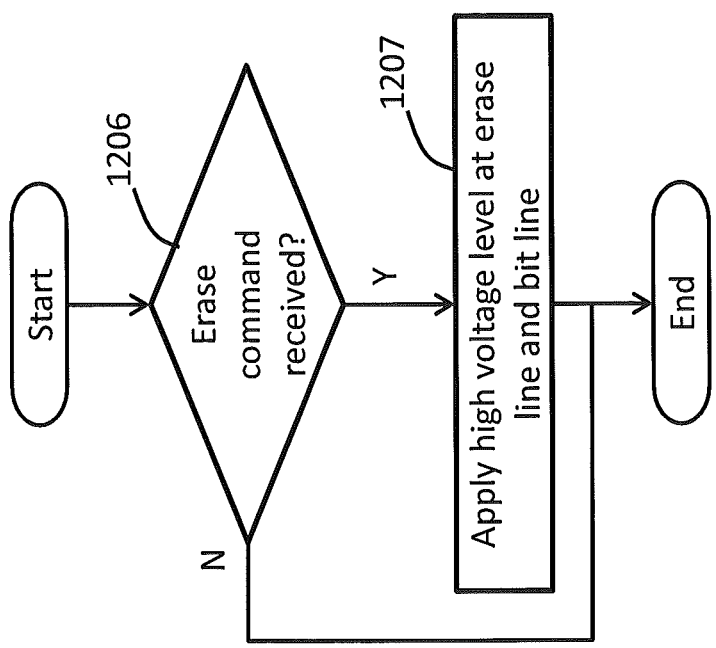

FIG. 12C illustrates a method of performing an erase operation with the graphene-based memory device according to one embodiment. In block 1206, it may be determined whether an erase command is received. The erase command may be received, for example, by a program or operating system operating on a processor. If the erase command is received, then in block 1207 a high voltage may be applied to an erase line and a bit line of a graphene-based memory device. The erase line may be connected to a top gate of the graphene-based memory. The high voltage at the top gate and the low voltage at the first graphene layer (due to an inverter along the bit line) results in the generation of an electrostatic force to pull the first graphene layer away from the second graphene layer and towards the top gate. Accordingly, the graphene-based memory may be erased and returned to an un-programmed state.

Figure 13:
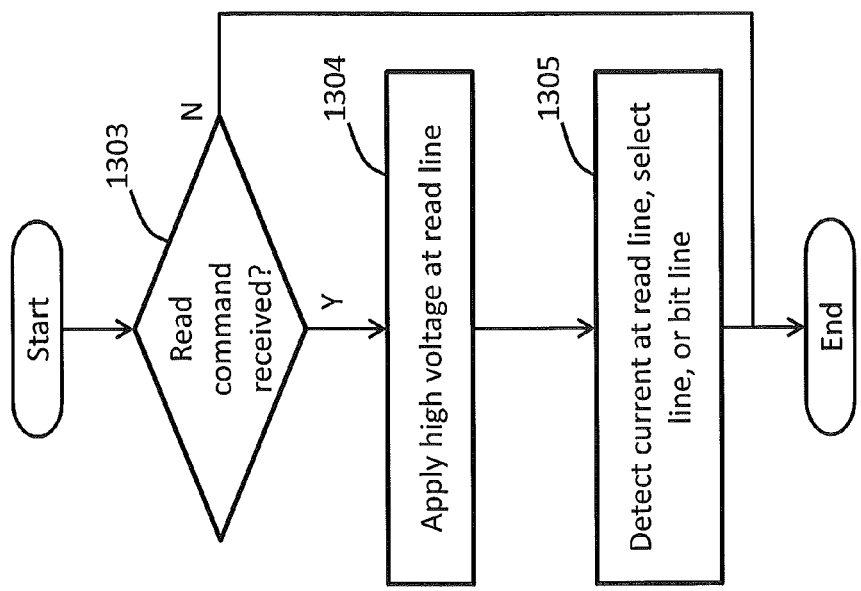
FIG. 13 is a flowchart illustrating a method of controlling graphene-based memory according to another embodiment.

FIGS. 12A and 12C may be applied to a graphene-based memory device including a continuous second graphene layer or a second graphene layer including a source and a drain separated by a slit or space. FIG. 13 illustrates a method of performing a read operation with a graphene-based memory device having a second graphene layer that includes a source and a drain separated by a slit. In block 1303, it is determined whether a read command is received. If a read command is received, a high voltage may be applied to a read line and a bit line or a high voltage to a read line and low voltage to the select line of the graphene-based memory device in block 1304, where the bit line is connected to the memory device via an inverter. A current may be detected in block 1305 at a read line, the select line or the bit line. If a high current is detected, then it may be determined that the memory device is in a programmed state, and if low current is detected, it may be determined that the memory device is in an un-programmed state.

According to the above-described embodiments, a graphene-based memory device may be programmed to a predetermined state, read, and erased according to the structure of the memory device. The memory device may be a non-volatile memory device that holds its state even when no power is supplied to the device.

FIGS. 14-23 illustrate methods of fabricating a graphene-based memory device according to embodiments of the present disclosure.

In FIG. 14, an insulation layer 109 is grown or deposited on a substrate 108. The substrate 108 may include any type of substrate, such as a silicon-based substrate, silicon-on-insulator (SOI), silicon-carbon, or any other type of substrate. The insulation layer 109 may also include silicon-based insulators, such as silicon oxide, silicon nitride, or any other appropriate insulator, including non-silicon-based insulators.

An opening may be patterned and etched in the insulation layer 109 and a highly-doped poly-silicon or metal may fill in the opening to form the back gate 105. Chemical mechanical planarization (CMP) may be performed on the insulation layer 109 and the back gate 105. In FIG. 15, an insulation layer 106 is formed on the insulation layer 109 and the back gate 105. A graphene layer 102 (the "second graphene layer 102") is formed on the insulation layer 109. The graphene layer 102 can be patterned by lithography and oxygen plasma etching.

Figure 16:
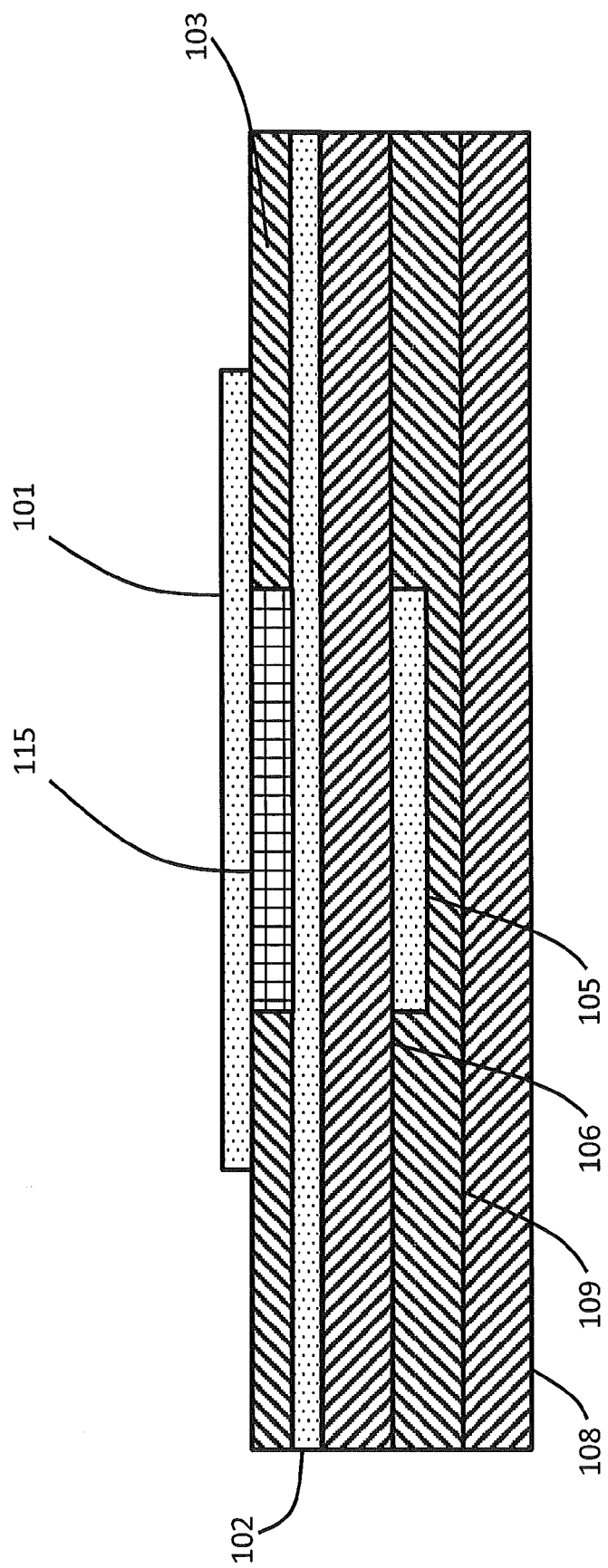

In FIG. 16, an insulation layer 103 is deposited on the second graphene layer 102, and a graphene layer 101 ("first graphene layer 101") is formed on the insulation layer 103. A dummy insulation layer 115 is formed in the insulator 103 by lithography, etch, deposition, CMP, or any other method. The first graphene layer 101 may be deposited on the insulation and may be patterned using lithography and oxygen plasma, for example.

Figure 17:
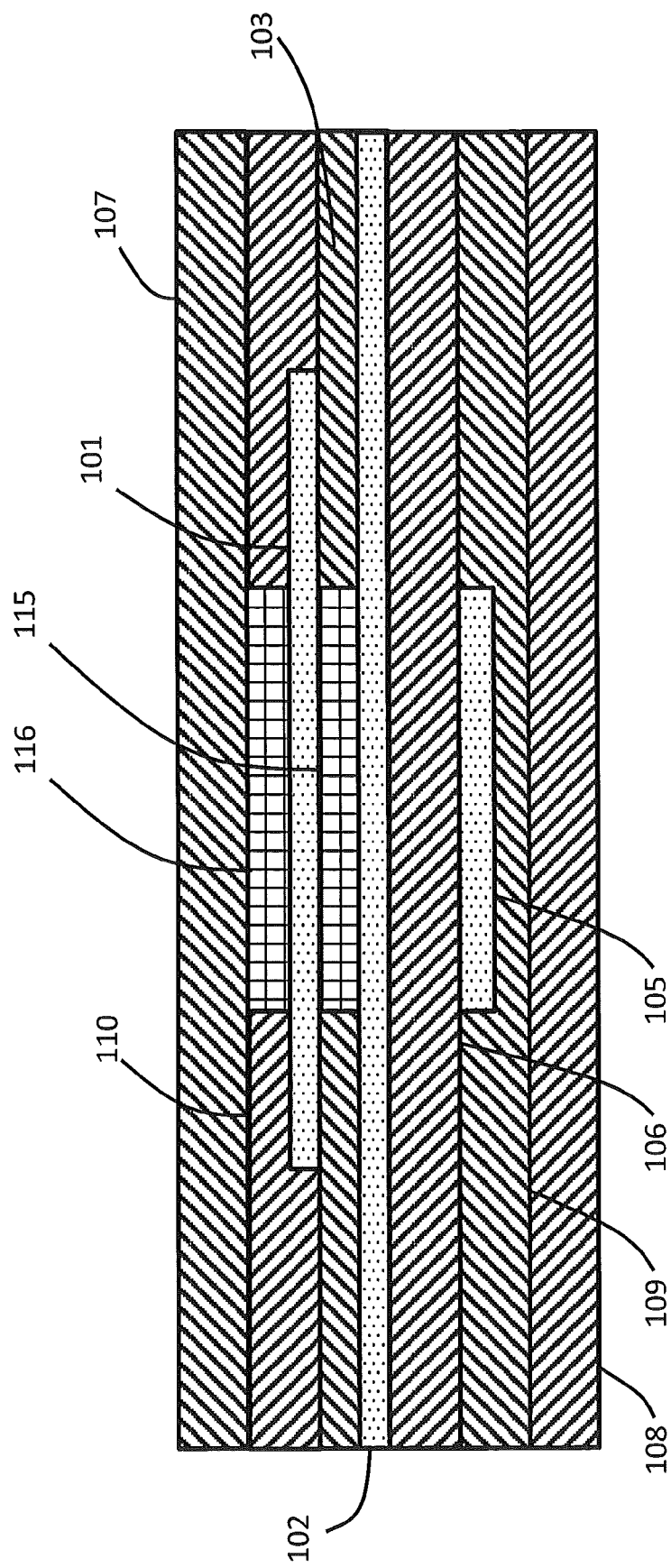
Figure 18:
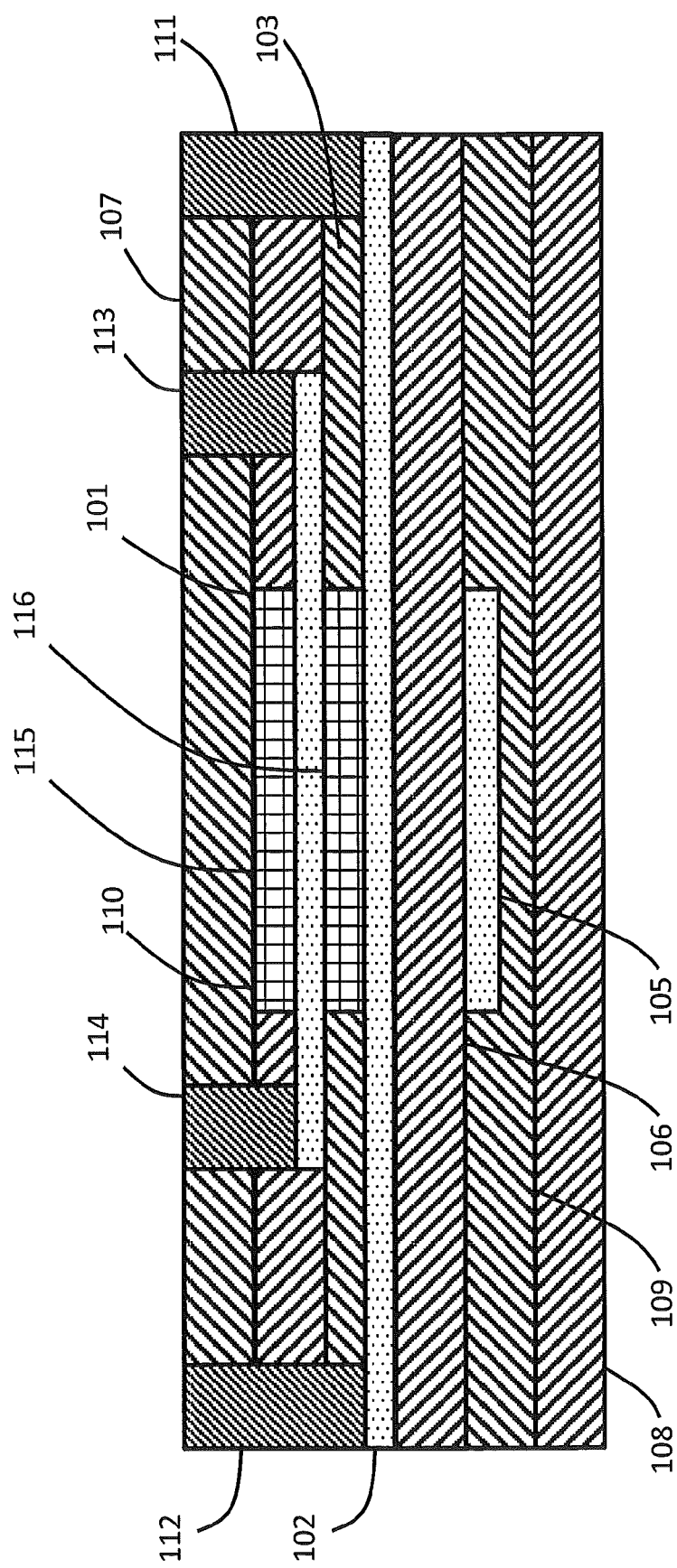

In FIG. 17, an insulation layer 110 is formed on the insulation layer 103 and the first graphene layer 101. A dummy insulation layer 116 is formed in the insulator 110 by lithography, etch, deposition, CMP, or any other method. An insulation layer 107 is formed on the insulation layer 110 and the dummy insulation layer 116. In FIG. 18, contact holes are formed and conductive materials, such as metals, are inserted into the contact holes to form electrodes, including drain electrodes 111 and 112 and floating channel electrodes 113 and 114. CMP may be performed on the insulation layer 107, the drain electrodes 111 and 112 and the floating channel electrodes 113 and 114.

Figure 19:
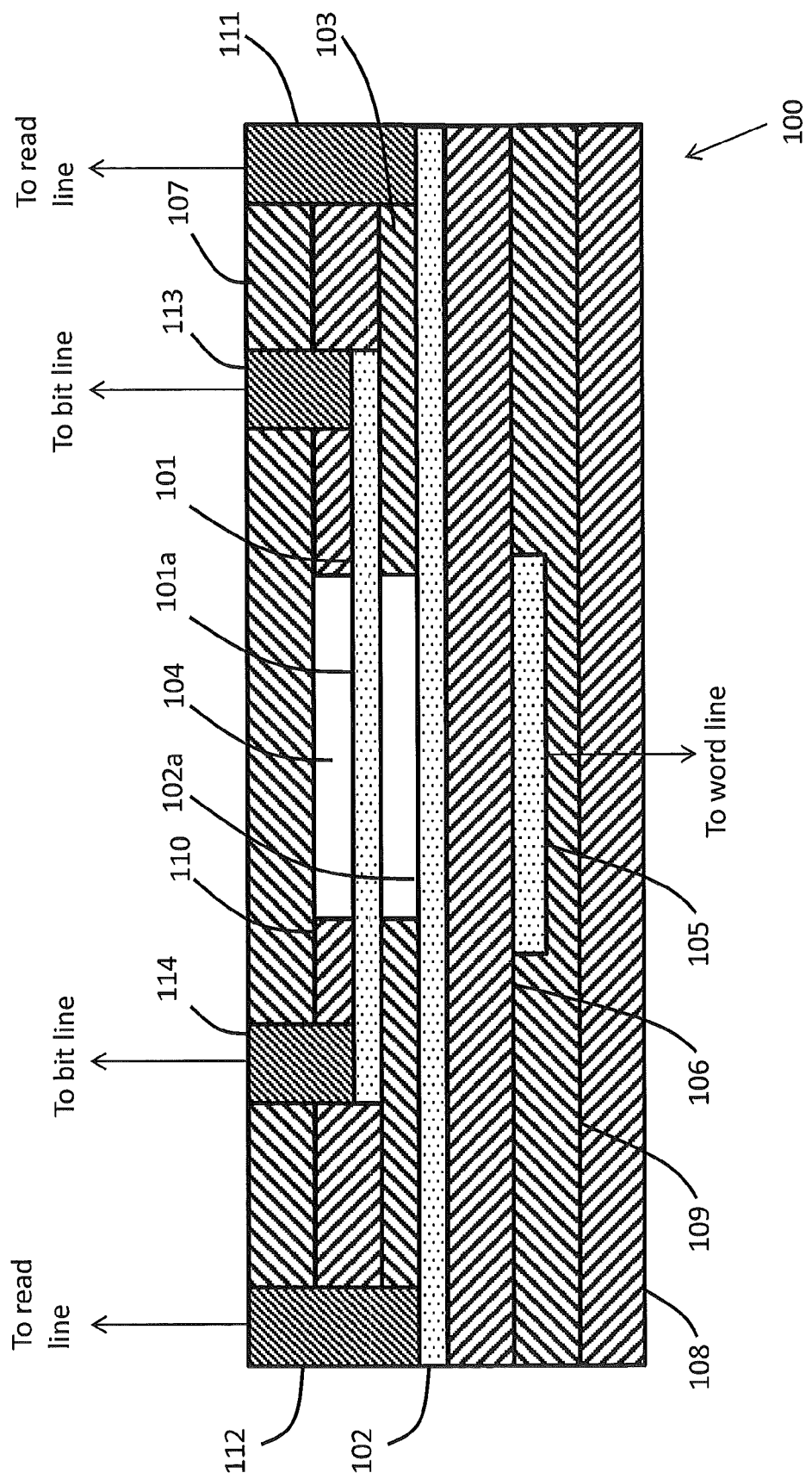

In FIG. 19, an opening 104 is formed in the insulation layers 103 and 110 by removing the dummy layers 115 and 116 to expose a suspended portion 101a of the first graphene layer 101 and an exposed portion 102a of the second graphene layer 102 to the opening 104. The opening 104 may be formed by lithography and etching, for example. The drains 111 and 112 may be connected to a read line, the floating channel electrodes 113 and 114 may be connected to a bit line, and the back gate 105 may be connected to a word line to form a programmable graphene-based memory circuit.

Figure 20:
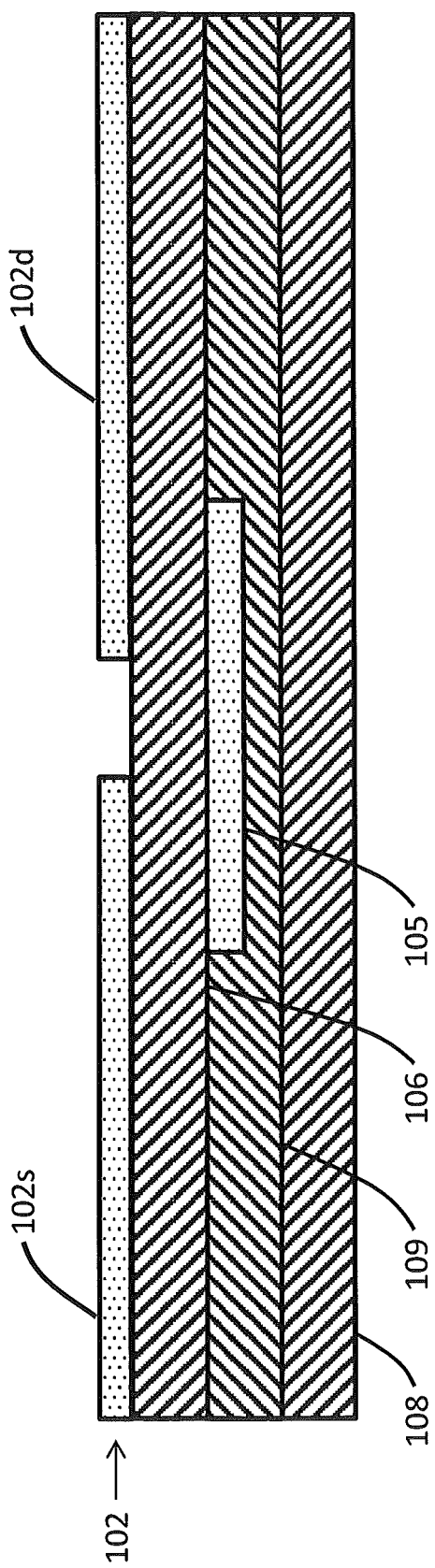
FIG. 20 illustrates a method of fabricating a memory device according to another embodiment in which the lower graphene layer includes a source portion and a drain portion.

FIG. 20 illustrates the formation of the second graphene layer 102 corresponding to the memory device 400 of FIG. 4. The process for forming the memory device 400 is similar to the process for forming the memory device 100 of FIG. 1, except after transferring the second graphene layer 102 onto the insulation layer 106, the second graphene layer 102 is patterned and etched to form the source portion 102s and the drain portion 102d. The additional insulation layers and graphene layer are then provided as set forth in FIGS. 16-19.

Figure 21:
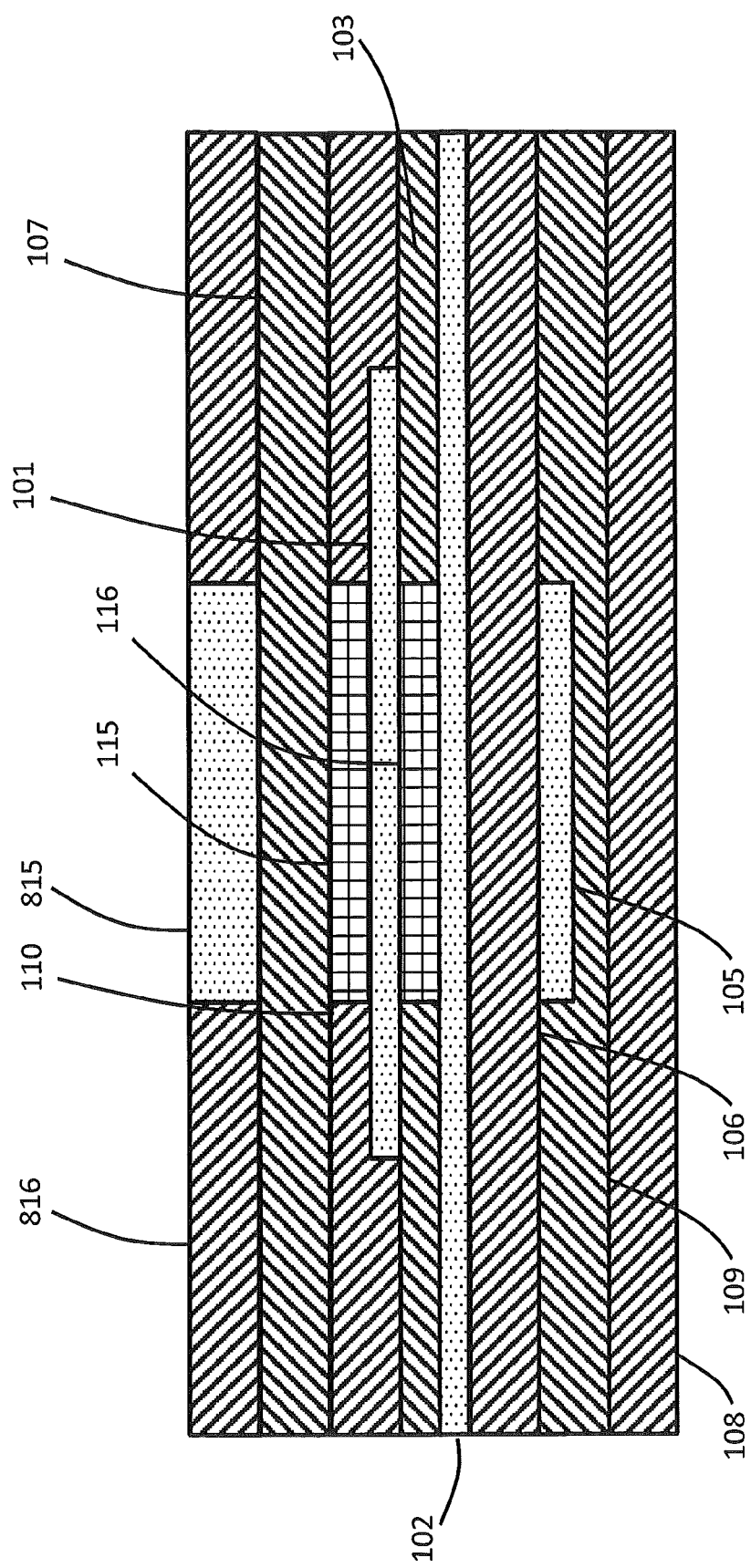
FIGS. 21-23 illustrate a method of fabricating a memory device according to another embodiment.
Figure 22:
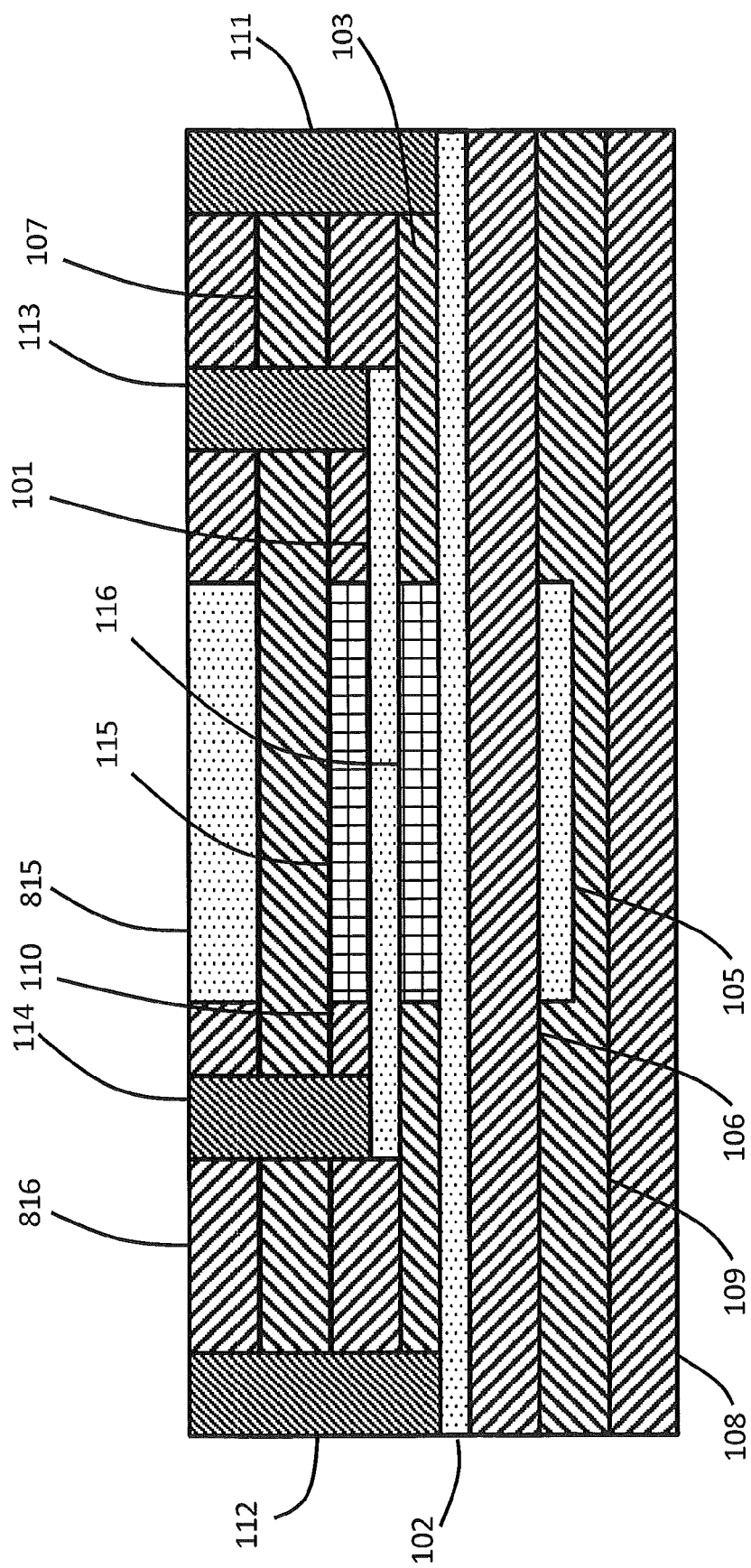

FIGS. 14-17 and 21-23 illustrate a method of fabricating a graphene memory device 800 according to an embodiment of the present disclosure. After forming the insulation layer 107 on the insulation layer 110, as illustrated in FIG. 17, an insulation layer 816 is formed on the insulation layer 107, as illustrated in FIG. 21. A top gate 815 may be formed in the insulation layer 816 by lithography, reactive ion etching (RIE), metal deposition, CMP or any other appropriate method. In FIG. 22, contact holes are formed and conductive materials, such as metals, are inserted into the contact holes to form electrodes, including drain electrodes 111 and 112 and floating channel electrodes 113 and 114. CMP may be performed on the insulation layer 816, the drain electrodes 111 and 112, and the floating channel electrodes 113 and 114.

Figure 23:
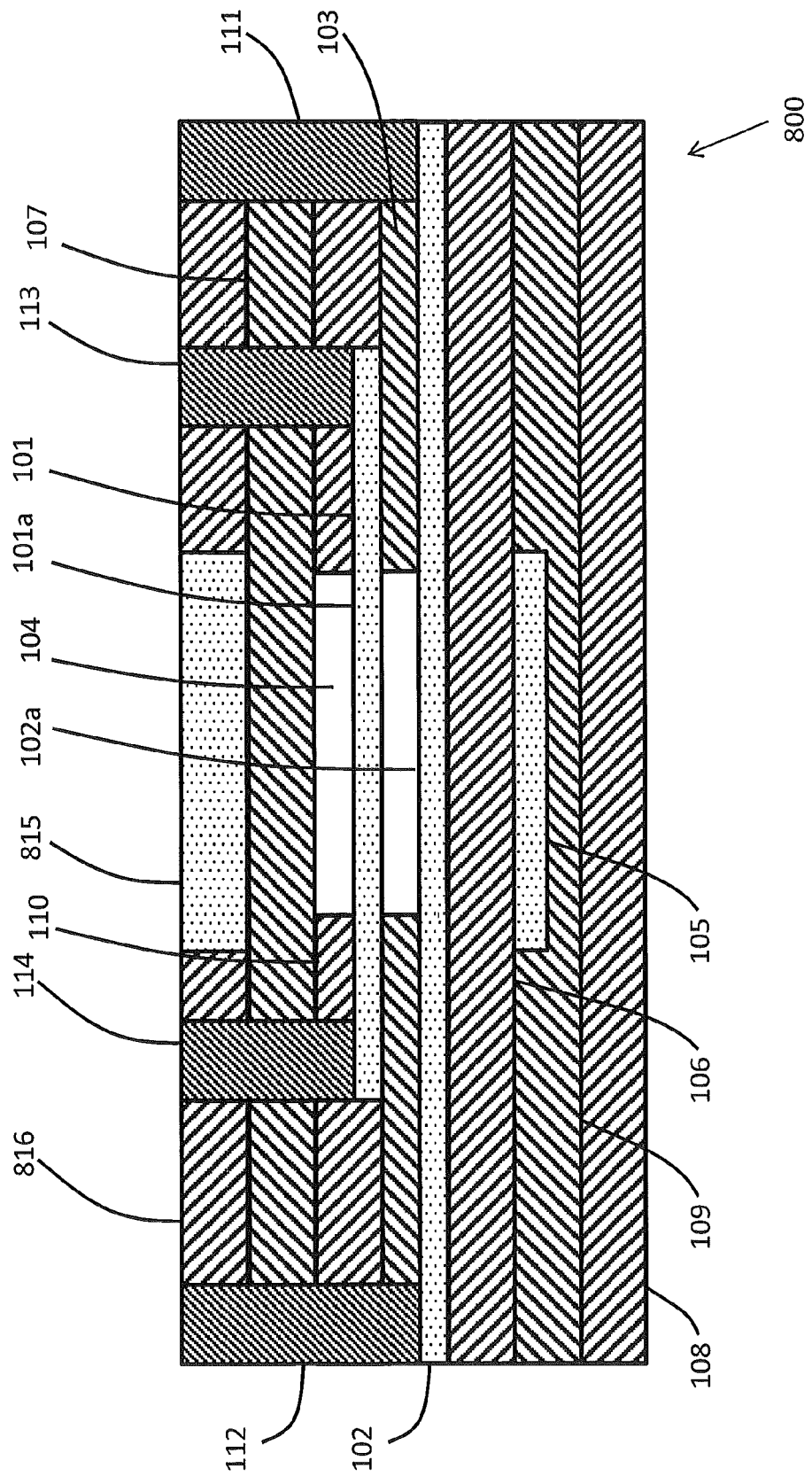

In FIG. 23, an opening 104 is formed in the insulation layers 103 and 110 to expose a suspended portion 101a of the first graphene layer 101 and an exposed portion 102a of the second graphene layer 102 to the opening 104. The opening 104 may be formed by lithography and etching, for example. The drains 111 and 112 may be connected to a read line, the floating channel electrodes 113 and 114 may be connected to a bit line, the back gate 105 may be connected to a word line and the top gate 815 may be connected to an erase line to form an erasable and programmable graphene-based memory circuit.

Fabrication of the graphene memory device 1000 of FIG. 10 is similar to that of FIGS. 14-17 and 21-23, except the process of FIG. 20 is performed on the second graphene layer 102 to form the source portion 102s and the drain portion 102d.

According to the above-described embodiments, a graphene-based non-volatile memory device may be fabricated by deposition, etching, lithography, and similar processes. The device may be fabricated to be a write-once device or an erasable and re-programmable device, for example. The device may be fabricated to be read based on a current or voltage output according to design considerations. The graphene-based non-volatile memory device does not require power to maintain programmed information.

Figure 24:
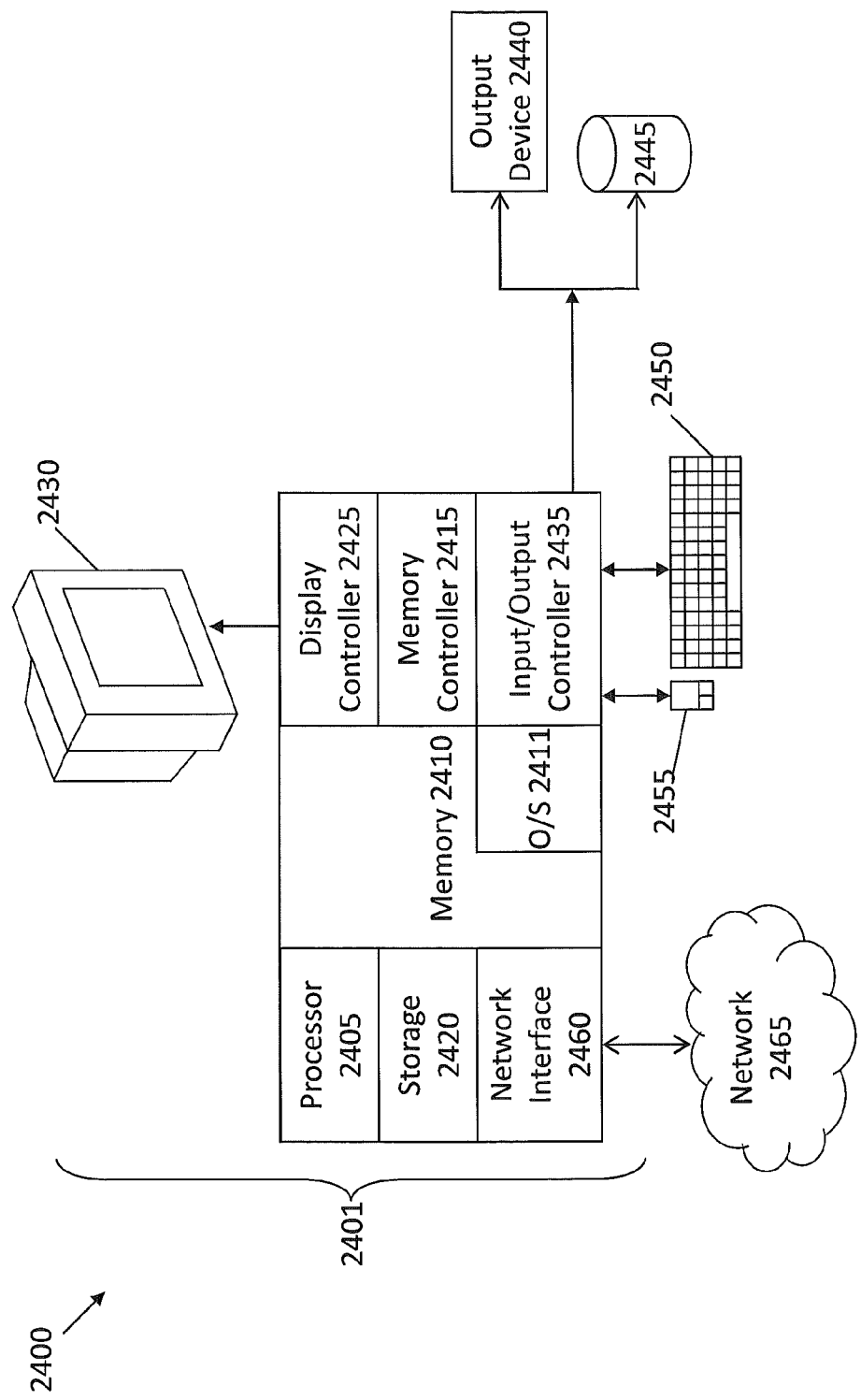
FIG. 24 illustrates a computing system according to an embodiment of the present disclosure.

FIG. 24 illustrates a block diagram of a computer system 2400 according to another embodiment of the present disclosure. The methods described herein can be implemented in hardware, software (e.g., firmware), or a combination thereof. In an exemplary embodiment, the methods described herein are implemented in hardware as part of the microprocessor of a special or general-purpose digital computer, such as a personal computer, workstation, minicomputer, or mainframe computer. The system 2300 therefore may include general-purpose computer or mainframe 2401.

In an exemplary embodiment, in terms of hardware architecture, as shown in FIG. 24, the computer 2401 includes a one or more processors 2405, memory 2410 coupled to a memory controller 2415, and one or more input and/or output (I/O) devices 2440, 2445 (or peripherals) that are communicatively coupled via a local input/output controller 2435. The input/output controller 2435 can be, for example, one or more buses or other wired or wireless connections, as is known in the art. The input/output controller 2435 may have additional elements, which are omitted for simplicity in description, such as controllers, buffers (caches), drivers, repeaters, and receivers, to enable communications. Further, the local interface may include address, control, and/or data connections to enable appropriate communications among the aforementioned components. The input/output controller 2435 may include a plurality of sub-channels configured to access the output devices 2440 and 2445. The sub-channels may include, for example, fiber-optic communications ports.

In one embodiment, one or more of the I/O devices 2440 and 2445 is a non-volatile memory device corresponding to the graphene memory devices 100, 400, 800 or 1000 of FIG. 1, 4, 8 or 10, respectively.

The processor 2405 is a hardware device for executing software, particularly that stored in storage 2420, such as cache storage, or memory 2410. The processor 2405 can be any custom made or commercially available processor, a central processing unit (CPU), an auxiliary processor among several processors associated with the computer 2401, a semiconductor based microprocessor (in the form of a microchip or chip set), a macroprocessor, or generally any device for executing instructions.

The memory 2410 can include any one or combination of volatile memory elements (e.g., random access memory (RAM, such as DRAM, SRAM, SDRAM, etc.)) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 2410 may incorporate electronic, magnetic, optical, graphene-based and/or other types of storage media. For example, in one embodiment, the memory 2410 includes one or more graphene memory devices 100, 400, 800 or 1000 of FIG. 1, 4, 8 or 10, respectively. Note that the memory 2410 can have a distributed architecture, where various components are situated remote from one another, but can be accessed by the processor 2405.

The instructions in memory 2410 may include one or more separate programs, each of which comprises an ordered listing of executable instructions for implementing logical functions. In the example of FIG. 24, the instructions in the memory 2410 include a suitable operating system (O/S) 2411. The operating system 2411 essentially controls the execution of other computer programs and provides scheduling, input-output control, file and data management, memory management, and communication control and related services.

In an exemplary embodiment, a conventional keyboard 2450 and mouse 2455 can be coupled to the input/output controller 2435. Other output devices such as the I/O devices 2440, 2445 may include input devices, for example but not limited to a printer, a scanner, microphone, and the like. Finally, the I/O devices 2440, 2445 may further include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like. The system 2400 can further include a display controller 2425 coupled to a display 2430. In an exemplary embodiment, the system 2400 can further include a network interface 2460 for coupling to a network 2465. The network 2465 can be an IP-based network for communication between the computer 2401 and any external server, client and the like via a broadband connection. The network 2465 transmits and receives data between the computer 2401 and external systems. In an exemplary embodiment, network 2465 can be a managed IP network administered by a service provider. The network 2465 may be implemented in a wireless fashion, e.g., using wireless protocols and technologies, such as WiFi, WiMax, etc. The network 2465 can also be a packet-switched network such as a local area network, wide area network, metropolitan area network, Internet network, or other similar type of network environment. The network 2465 may be a fixed wireless network, a wireless local area network (LAN), a wireless wide area network (WAN) a personal area network (PAN), a virtual private network (VPN), intranet or other suitable network system and includes equipment for receiving and transmitting signals.

When the computer 2401 is in operation, the processor 2405 is configured to execute instructions stored within the memory 2410, to communicate data to and from the memory 2410, and to generally control operations of the computer 2401 pursuant to the instructions.

In an exemplary embodiment, the methods of managing memory described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array (s) (PGA), a field programmable gate array (FPGA), etc.

Aspects of the present disclosure are described above with reference to flowchart illustrations and/or block diagrams of methods, apparatuses or systems according to embodiments of the disclosure. It will be understood that some blocks of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present disclosure. In this regard, blocks in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

While the preferred embodiment to the disclosure had been described, it will be understood that those skilled in the art, both now and in the future, may make various improvements and enhancements which fall within the scope of the claims which follow. These claims should be construed to maintain the proper protection for the disclosure first described.

What is claimed is:

1. A method of forming a graphene-based memory device, comprising:
   forming a first graphene layer on a first insulator layer;
   forming a second insulation layer on the first graphene layer;
   forming a second graphene layer on the second insulation layer; and
   forming an opening in the second insulation layer to expose a portion of the first graphene layer and a portion of the second graphene layer and to suspend the exposed portion of the second graphene layer in the opening, the opening in the second insulation layer having a depth and width such that the second graphene layer is configured to bend into the opening to contact the first graphene layer based on an electrostatic force being applied to the second graphene layer.

2. The method of claim 1, further comprising:
   forming a third insulation layer on a substrate;
   forming a back gate in the third insulator; and
   forming the first insulation layer on the back gate.

3. The method of claim 1, further comprising:
   patterning the first graphene layer to include a slit separating two portions of the first graphene layer at a location corresponding to the exposed portion of the first graphene layer.

4. The method of claim 1, wherein forming an opening in the second insulation layer includes etching the second insulation layer prior to forming the second graphene layer on the second insulation layer.

5. The method of claim 1, wherein forming the second insulation layer includes forming a dummy region in the second insulation layer having a chemical composition different from a rest of the second insulation layer, and
   forming the opening in the second insulation layer includes performing a chemical etching process to remove the dummy layer from the second insulation layer.

6. The method of claim 1, further comprising:
   forming a fourth insulation layer on the second insulation layer and the second graphene layer,
   wherein forming the opening includes forming the opening in both the second insulation layer and the fourth insulation layer.

7. The method of claim 6, further comprising:
   forming a fifth insulation layer on the fourth insulation layer; and
   forming a top gate in the fifth insulation layer, the top gate aligned with the opening and the back gate.

8. The method of claim 7, further comprising:
   patterning the first graphene layer to include a slit separating two portions of the first graphene layer at a location corresponding to the exposed portion of the first graphene layer.

9. The method of claim 7, further comprising:
   forming a first conductive contact through the second and fourth insulation layers to contact the first graphene layer; and
   forming a second conductive contact through the fourth insulation layer to contact the second graphene layer.

10. The method of claim 9, further comprising:
    forming a read line contacting the first conductive contact;
    forming a bit line contacting the second conductive contact; and
    forming a word line contacting the back gate.

11. A method of forming a graphene-based memory device comprising:
    providing a substrate;
    forming a first insulator on the substrate;
    forming a back gate in the first insulation layer;
    forming a second insulation layer on the back gate and the first insulation layer;
    transferring a lower graphene layer onto the second insulation layer;
    forming a third insulation layer on the lower graphene layer;
    forming an upper graphene layer on the third insulation layer; and
    forming an opening in the third insulation layer between the lower graphene layer and the upper graphene layer to form a suspended portion of the upper graphene layer and an exposed portion of the lower graphene layer, the opening in the third insulation layer having a depth and width such that the upper graphene layer is configured to bend into the opening to contact the lower graphene layer based on an electrostatic force being applied to the upper graphene layer.

12. The method of claim 11, further comprising:
patterning the lower graphene layer to include a slit separating two portions of the lower graphene layer at a location corresponding to the exposed portion of the lower graphene layer.

13. The method of claim 11, further comprising:
forming a fourth insulation layer on the upper graphene layer and the third insulation layer,
wherein forming the opening in the third insulation layer includes forming an opening in the fourth insulation layer.

14. The method of claim 13, further comprising:
forming at least one first contact via extending through the third and fourth insulation layers to the lower graphene layer;
forming at least one second contact via extending through the fourth insulation layer to the upper graphene layer; and
filling the at least one first contact via and the at least one second contact via with conductive material to form at least one drain connected to the lower graphene layer and at least one floating channel connected to the upper graphene layer.

15. The method of claim 13, further comprising:
forming a fifth insulation layer on the fourth insulation layer;
etching a portion of the fifth insulation layer above the suspended portion of the upper graphene layer; and
filling the etched portion of the fifth insulation layer with a conductive material and performing chemical mechanical planarization (CMP) to form a top gate.

16. The method of claim 15, further comprising:
forming at least one first contact via extending through the third, fourth and fifth insulation layers to the lower graphene layer;
forming at least one second contact via extending through the fourth and fifth insulation layer to the upper graphene layer; and
filling the at least one first contact via and the at least one second contact via with conductive material to form at least one drain connected to the lower graphene layer and at least one floating channel connected to the upper graphene layer.

17. The method of claim 16, further comprising:
patterning the lower graphene layer to include a slit separating two portions of the lower graphene layer at a location corresponding to the exposed portion of the lower graphene layer.

18. A method of forming a graphene-based memory circuit, comprising:
forming a graphene-based memory device including first and second graphene layers and a back gate, the first graphene layer bendable with respect to the second graphene layer to selectively contact the second graphene layer based on a voltage level of the backgate;
forming a word line connected to the back-gate;
forming a bit line connected to the first graphene layer; and
forming a read line connected to the second graphene layer.

19. The method of claim 18, wherein forming the graphene-based memory device comprises:
providing a substrate;
forming a first insulator on the substrate;
forming the back gate in the first insulation layer;
forming a second insulation layer on the back gate and the first insulation layer;
transferring the second lower graphene layer onto the second insulation layer;
forming a third insulation layer on the lower graphene layer;
forming the first graphene layer on the third insulation layer; and
forming an opening in the third insulation layer between the second graphene layer and the first graphene layer to form a suspended portion of the first graphene layer and an exposed portion of the second graphene layer.

20. The method of claim 19, wherein forming the graphene-based memory device further comprises forming a top gate located in line with the opening in the third insulation layer, the top gate configured to generate an electrostatic force to bend the upper graphene layer away from the lower graphene layer based on a voltage level of the top gate.

21. The method of claim 20, wherein forming the memory circuit further comprises forming an erase line connected to the top gate.

* * * * *